US010635585B2

(12) United States Patent
Kashyap et al.

(10) Patent No.: US 10,635,585 B2
(45) Date of Patent: Apr. 28, 2020

(54) ON-CHIP COPY WITH DATA FOLDING IN THREE-DIMENSIONAL NON-VOLATILE MEMORY ARRAY

(71) Applicant: Western Digital Technologies, Inc., San Jose, CA (US)

(72) Inventors: Abhilash R. Kashyap, San Jose, CA (US); Gautam A. Dusija, Burlingame, CA (US); Deepak Raghu, San Jose, CA (US); Chris Nga Yee Yip, Saratoga, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 216 days.

(21) Appl. No.: 16/010,234

(22) Filed: Jun. 15, 2018

(65) Prior Publication Data

US 2019/0354478 A1    Nov. 21, 2019

Related U.S. Application Data

(60) Provisional application No. 62/671,950, filed on May 15, 2018.

(51) Int. Cl.
*G06F 12/00* (2006.01)
*G06F 12/06* (2006.01)
(Continued)

(52) U.S. Cl.
CPC .......... *G06F 12/0607* (2013.01); *G06F 3/065* (2013.01); *G06F 3/0619* (2013.01);
(Continued)

(58) Field of Classification Search
None
See application file for complete search history.

(56) References Cited

U.S. PATENT DOCUMENTS 9,268,657 B1    2/2016 Horn
2008/0034153 A1    2/2008 Lee et al.
(Continued)

OTHER PUBLICATIONS

International Search Report dated Jun. 26, 2019 for International Patent Application No. PCT/US2019/022462, 4 pages.
(Continued)

*Primary Examiner* — David Yi
*Assistant Examiner* — Craig S Goldschmidt
(74) *Attorney, Agent, or Firm* — Morgan, Lewis & Bockius LLP

(57) ABSTRACT

In an on-chip copy process, performed by a storage device, data is copied from a plurality of Single Level Cell (SLC) blocks of non-volatile three-dimensional memory (e.g., 3D flash memory) in a respective memory die to a Multilevel Cell (MLC) block of the same memory die. A copy of source data from a respective SLC block is interleaved with a copy of source data from one or more other SLC blocks in the memory die to produce interleaved source data. Each source data copy that is interleaved is rotated by an offset assigned to the respective SLC block from which the source data is copied, and each respective SLC block in the plurality of SLC blocks is assigned a distinct offset. Each distinct set of the interleaved source data is written to a distinct respective MLC page of the MLC block.

24 Claims, 14 Drawing Sheets

Data Storage System 100

(51) Int. Cl.
    *G06F 3/06*         (2006.01)
    *G11C 29/52*      (2006.01)
    *G06F 11/10*      (2006.01)

(52) U.S. Cl.
    CPC ........ *G06F 3/0679* (2013.01); *G06F 11/1072* (2013.01); *G11C 29/52* (2013.01); *G06F 2212/1032* (2013.01); *G06F 2212/2022* (2013.01); *G06F 2212/7205* (2013.01)

(56) References Cited

U.S. PATENT DOCUMENTS

| | | |
|---|---|---|
| 2012/0191903 A1 | 7/2012 | Araki et al. |
| 2016/0268000 A1 | 9/2016 | Thompson et al. |
| 2017/0115884 A1* | 4/2017 | Bhalerao ................ G06F 3/0604 |
| 2017/0123726 A1* | 5/2017 | Sinclair ................ G06F 3/0659 |

OTHER PUBLICATIONS

Written Opinion dated Jun. 26, 2019 for International Patent Application No. PCT/US2019/022462, 4 pages.

* cited by examiner

Figure 6

TLC10

| TLC PWL | TLC LWL | Ch0 | | | | | | Ch1 | | | | | | Ch2 | | | | | | Ch3 | | | | | |
|---|---|---|---|---|---|---|---|---|---|---|---|---|---|---|---|---|---|---|---|---|---|---|---|---|---|
| | | PL0 | | | PL1 | | | PL0 | | | PL1 | | | PL0 | | | PL1 | | | PL0 | | | PL1 | | |
| | | LP | MP | UP | LP | MP | UP | LP | MP | UP | LP | MP | UP | LP | MP | UP | LP | MP | UP | LP | MP | UP | LP | MP | UP |
| 0 | 0 | 0 | 1 | 2 | 0 | 1 | 2 | 0 | 1 | 2 | 0 | 1 | 2 | 0 | 1 | 2 | 0 | 1 | 2 | 0 | 1 | 2 | 0 | 1 | 2 |
| | 1 | 1 | 2 | 3 | 1 | 2 | 3 | 1 | 2 | 3 | 1 | 2 | 3 | 1 | 2 | 3 | 1 | 2 | 3 | 1 | 2 | 3 | 1 | 2 | 3 |
| 1 | 2 | 2 | 3 | 0 | 2 | 3 | 0 | 2 | 3 | 0 | 2 | 3 | 0 | 2 | 3 | 0 | 2 | 3 | 0 | 2 | 3 | 0 | 2 | 3 | 0 |
| | 3 | 3 | 0 | 1 | 3 | 0 | 1 | 3 | 0 | 1 | 3 | 0 | 1 | 3 | 0 | 1 | 3 | 0 | 1 | 3 | 0 | 1 | 3 | 0 | 1 |
| | 4 | 6 | 4 | 5 | 6 | 4 | 5 | 6 | 4 | 5 | 6 | 4 | 5 | 6 | 4 | 5 | 6 | 4 | 5 | 6 | 4 | 5 | 6 | 4 | 5 |
| | 5 | 7 | 5 | 6 | 7 | 5 | 6 | 7 | 5 | 6 | 7 | 5 | 6 | 7 | 5 | 6 | 7 | 5 | 6 | 7 | 5 | 6 | 7 | 5 | 6 |
| | 6 | 4 | 6 | 7 | 4 | 6 | 7 | 4 | 6 | 7 | 4 | 6 | 7 | 4 | 6 | 7 | 4 | 6 | 7 | 4 | 6 | 7 | 4 | 6 | 7 |
| | 7 | 5 | 7 | 4 | 5 | 7 | 4 | 5 | 7 | 4 | 5 | 7 | 4 | 5 | 7 | 4 | 5 | 7 | 4 | 5 | 7 | 4 | 5 | 7 | 4 |
| ... | ... | ... | ... | ... | ... | ... | ... | ... | ... | ... | ... | ... | ... | ... | ... | ... | ... | ... | ... | ... | ... | ... | ... | ... | ... |
| 63 | 252 | 252 | 253 | 254 | 252 | 253 | 254 | 252 | 253 | 254 | 252 | 253 | 254 | 252 | 253 | 254 | 252 | 253 | 254 | 252 | 253 | 254 | 252 | 253 | 254 |
| | 253 | 253 | 254 | 255 | 253 | 254 | 255 | 253 | 254 | 255 | 253 | 254 | 255 | 253 | 254 | 255 | 253 | 254 | 255 | 253 | 254 | 255 | 253 | 254 | 255 |
| | 254 | 254 | 255 | 252 | 254 | 255 | 252 | 254 | 255 | 252 | 254 | 255 | 252 | 254 | 255 | 252 | 254 | 255 | 252 | 254 | 255 | 252 | 254 | 255 | 252 |
| | 255 | 255 | 252 | 253 | 255 | 252 | 253 | 255 | 252 | 253 | 255 | 252 | 253 | 255 | 252 | 253 | 255 | 252 | 253 | 255 | 252 | 253 | 255 | 252 | 253 |

| Src 0 | | X1 Stripe | Ch0 | | Ch1 | | Ch2 | | Ch3 | |
|---|---|---|---|---|---|---|---|---|---|---|
| WL | String | Page# | PL0 | PL1 | PL0 | PL1 | PL0 | PL1 | PL0 | PL1 |
| 0 | 0 | 0 | 0 | 0 | 0 | 0 | 0 | 0 | 0 | 0 |
|   | 1 | 1 | 1 | 1 | 1 | 1 | 1 | 1 | 1 | 1 |
|   | 2 | 2 | 2 | 2 | 2 | 2 | 2 | 2 | 2 | 2 |
|   | 3 | 3 | 3 | 3 | 3 | 3 | 3 | 3 | 3 | 3 |
| 1 | 0 | 4 | 4 | 4 | 4 | 4 | 4 | 4 | 4 | 4 |
|   | 1 | 5 | 5 | 5 | 5 | 5 | 5 | 5 | 5 | 5 |
|   | 2 | 6 | 6 | 6 | 6 | 6 | 6 | 6 | 6 | 6 |
|   | 3 | 7 | 7 | 7 | 7 | 7 | 7 | 7 | 7 | 7 |
| 2 | 0 | 8 | 0 | 0 | 0 | 0 | 0 | 0 | 0 | 0 |
|   | 1 | 9 | 1 | 1 | 1 | 1 | 1 | 1 | 1 | 1 |
|   | 2 | 10 | 2 | 2 | 2 | 2 | 2 | 2 | 2 | 2 |
|   | 3 | 11 | 3 | 3 | 3 | 3 | 3 | 3 | 3 | 3 |
| . | . | . | . | . | . | . | . | . | . | . |
| 62 | 0 | 248 | 0 | 0 | 0 | 0 | 0 | 0 | 0 | 0 |
|   | 1 | 249 | 1 | 1 | 1 | 1 | 1 | 1 | 1 | 1 |
|   | 2 | 250 | 2 | 2 | 2 | 2 | 2 | 2 | 2 | 2 |
|   | 3 | 251 | 3 | 3 | 3 | 3 | 3 | 3 | 3 | 3 |
| 63 | 0 | 252 | 4 | 4 | 4 | 4 | 4 | 4 | 4 | 4 |
|   | 1 | 253 | 5 | 5 | 5 | 5 | 5 | 5 | 5 | 5 |
|   | 2 | 254 | 0 | 1 | 2 | 3 | 4 | 5 | 6 | 7 |
|   | 3 | 255 | 7 | 6 | 5 | 4 | 3 | 2 | 1 | 0 |

Table 902:

| TLC LWL | TLC Pg # LP | Parity Stripe # | SLC LWL |
|---|---|---|---|
| 0 | 0 | 0 | 0 |
| 1 | 3 | 1 | 1 |
| 2 | 6 | 2 | 2 |
| 3 | 9 | 3 | 3 |
| 4 | 12 | 6 | 6 |
| 5 | 15 | 7 | 7 |
| 6 | 18 | 4 | 4 |
| 7 | 21 | 5 | 5 |
| 8 | 24 | 1 | 9 |
| 9 | 27 | 2 | 10 |
| 10 | 30 | 3 | 11 |
| 11 | 33 | 0 | 8 |
| 12 | 36 | 4 | 12 |
| 13 | 39 | 5 | 13 |
| 14 | 42 | 6 | 14 |
| 15 | 45 | 7 | 15 |
| 16 | 48 | 2 | 18 |
| 17 | 51 | 3 | 19 |
| 18 | 54 | 0 | 16 |
| 19 | 57 | 1 | 17 |
| ... | ... | ... | ... |
| 240 | 720 | 0 | 240 |
| 241 | 723 | 1 | 241 |
| 242 | 726 | 2 | 242 |
| 243 | 729 | 3 | 243 |
| 244 | 732 | 6 | 246 |
| 245 | 735 | 7 | 247 |
| 246 | 738 | 4 | 244 |
| 247 | 741 | 5 | 245 |
| 248 | 744 | 1 | 249 |
| 249 | 747 | 2 | 250 |
| 250 | 750 | 3 | 251 |
| 251 | 753 | 0 | 248 |
| 252 | 756 | 4 | 252 |
| 253 | 759 | 5 | 253 |
| 254 | 762 | 0,1,2,3,4,5,6,7 / 7,6,5,4,3,2,1,0 | 254 |
| 255 | 765 | 5 | 255 |

Table 904:

| TLC Pg # MP | Parity Stripe # | SLC LWL |
|---|---|---|
| 1 | 1 | 1 |
| 4 | 2 | 2 |
| 7 | 3 | 3 |
| 10 | 0 | 0 |
| 13 | 4 | 4 |
| 16 | 5 | 5 |
| 19 | 6 | 6 |
| 22 | 7 | 7 |
| 25 | 2 | 10 |
| 28 | 3 | 11 |
| 31 | 0 | 8 |
| 34 | 1 | 9 |
| 37 | 5 | 13 |
| 40 | 6 | 14 |
| 43 | 7 | 15 |
| 46 | 4 | 12 |
| 49 | 0 | 16 |
| 52 | 1 | 17 |
| 55 | 2 | 18 |
| 58 | 3 | 19 |
| ... | ... | ... |
| 721 | 1 | 241 |
| 724 | 2 | 242 |
| 727 | 3 | 243 |
| 730 | 0 | 240 |
| 733 | 4 | 244 |
| 736 | 5 | 245 |
| 739 | 6 | 246 |
| 742 | 7 | 247 |
| 745 | 2 | 250 |
| 748 | 3 | 251 |
| 751 | 0 | 248 |
| 754 | 1 | 249 |
| 757 | 5 | 253 |
| 760 | 0,1,2,3,4,5,6,7 / 7,6,5,4,3,2,1,0 | 254 |
| 763 | 4 | 255 |
| 766 | | 252 |

Table 906:

| TLC Pg # UP | Parity Stripe # | SLC LWL |
|---|---|---|
| 2 | 2 | 2 |
| 5 | 3 | 3 |
| 8 | 0 | 0 |
| 11 | 1 | 1 |
| 14 | 5 | 5 |
| 17 | 6 | 6 |
| 20 | 7 | 7 |
| 23 | 4 | 4 |
| 26 | 0 | 8 |
| 29 | 1 | 9 |
| 32 | 2 | 10 |
| 35 | 3 | 11 |
| 38 | 6 | 14 |
| 41 | 7 | 15 |
| 44 | 4 | 12 |
| 47 | 5 | 13 |
| 50 | 1 | 17 |
| 53 | 2 | 18 |
| 56 | 3 | 19 |
| 59 | 0 | 16 |
| ... | ... | ... |
| 722 | 2 | 242 |
| 725 | 3 | 243 |
| 728 | 0 | 240 |
| 731 | 1 | 241 |
| 734 | 5 | 245 |
| 737 | 6 | 246 |
| 740 | 7 | 247 |
| 743 | 4 | 244 |
| 746 | 0 | 248 |
| 749 | 1 | 249 |
| 752 | 2 | 250 |
| 755 | 3 | 251 |
| 758 | 0,1,2,3,4,5,6,7 / 7,6,5,4,3,2,1,0 | 254 |
| 761 | 4 | 255 |
| 764 | 5 | 252 |
| 767 | | 253 |

ON-CHIP COPY WITH DATA FOLDING IN THREE-DIMENSIONAL NON-VOLATILE MEMORY ARRAY

RELATED APPLICATIONS

This application claims priority to U.S. Provisional Patent Application No. 62/671,950 filed on May 15, 2018, which is hereby incorporated by reference in its entirety.

TECHNICAL FIELD

The disclosed embodiments relate generally to non-volatile memory systems, and in particular, to data folding in a storage device (e.g., comprising one or more flash memory devices).

BACKGROUND

This application relates to the operation of re-programmable non-volatile memory systems such as semiconductor flash memory which record data using charge stored in charge storage elements of memory cells and to methods of operating such memory systems.

Many non-volatile memories are formed along a surface of a substrate (e.g. silicon substrate) as two-dimensional (2D), or planar, memories. Other non-volatile memories are three-dimensional (3D) memories that are monolithically formed in one or more physical levels of memory cells having active areas disposed above a substrate.

In a non-volatile memory, such as 3D NAND flash memory, data may be rapidly written into one or more blocks of memory cells (sometimes herein called SLC blocks) configured to store data using Single Level Cell (SLC) formatting (with one bit of data stored in each memory cell) when the data is first received by the memory device. Subsequently, the data may be copied or folded into a smaller number of memory cells in one or more blocks of memory cells (sometimes herein called MLC blocks) configured to store data using Multilevel Cell (MLC) formatting, with more than one bit of data stored in each memory cell. When this coping is performed within a single chip, or single memory device, the copying process is sometimes called an on-chip copy (OCC) process. While OCC improves the density of data stored in non-volatile memory, and enables high speed initial writing of the data to the memory device, OCC processes have been found to require significant chip resources for computing parity information for the data being folded into MLC blocks. In addition, parity information produced by OCC processes is typically stored in concentrated clusters of memory locations in the MLC blocks, resulting in the memory locations with parity information being read more frequently than if the data and corresponding parity information had been stored in SLC blocks, which in turn makes the parity information particularly vulnerable to a problem known as read-disturb.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to enable data folding in a three-dimensional non-volatile memory array. When data is folded, an on-chip copy process is performed. In the on-chip copy (OCC) process, data is copied from a plurality of Single Level Cell (SLC) blocks of the non-volatile three-dimensional memory in a respective memory die to one Multilevel Cell (MLC) block of the non-volatile three-dimensional memory in the respective memory die.

In the OCC process, a copy of source data from a respective SLC block of the plurality of SLC blocks is interleaved with a copy of source data from one or more other SLC blocks of the plurality of SLC blocks to produce interleaved source data. Each source data copy that is interleaved is rotated by an offset assigned to the respective SLC block from which the source data is copied, and each respective SLC block in the plurality of SLC blocks is assigned a distinct offset. Each distinct set of the interleaved source data is written to a distinct respective MLC page of the MLC block.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 6 illustrates an example of source data interleaved and rotated from three SLC blocks to one TLC block in accordance with some embodiments.

FIG. 7 illustrates an example of source data folded from three SLC blocks to one TLC block in accordance with some embodiments.

FIG. 8 illustrates an example of a mapping that shows where parity data is stored in a set of SLC blocks, in accordance with some embodiments.

FIG. 9 illustrates an example of a mapping that shows where parity data, corresponding to data initially stored in a set of SLC blocks, is stored in a TLC block, in accordance with some embodiments.

Figure 1:
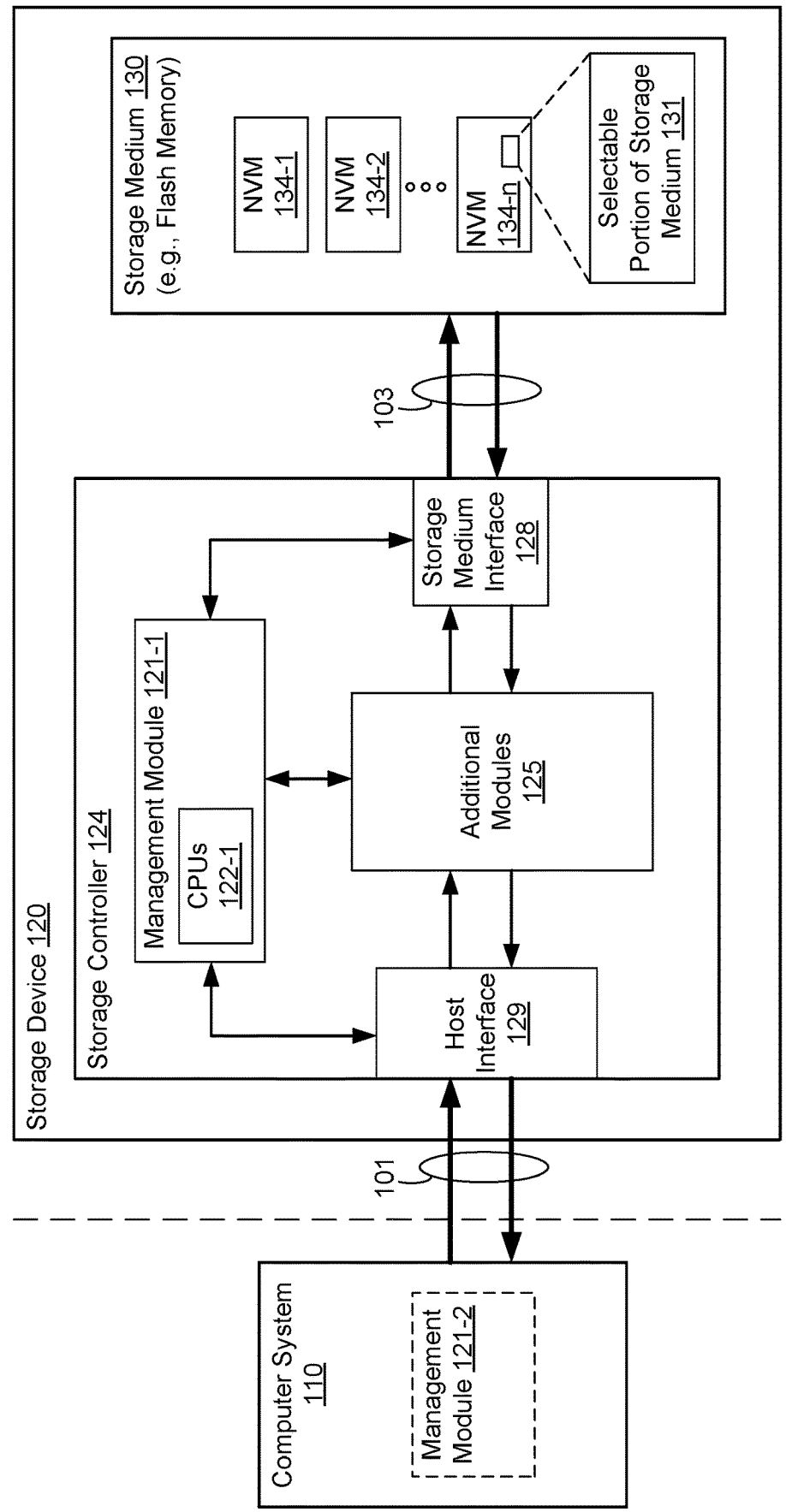
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a

DETAILED DESCRIPTION

The various implementations described herein include systems, methods and/or devices used to program data in a respective block of a three-dimensional non-volatile memory array, and to recover data in response to a word line to word line short circuit that occurs while programming data in the respective block or other word line failure. In addition to word line shorts, word line failures may stem from a phenomenon called "broken word line," which inhibits control voltages from propagating well through the control gates of the memory cells on a word line plate. Furthermore, two word lines can fail in different planes, for reasons that may or may not be related. For example, two word lines may fail together if they share a word line driver circuit that has failed.

(A1) More specifically, some embodiments include a method for managing data in a storage device having one or more memory die, each memory die comprising a non-volatile three-dimensional memory having a plurality of blocks, each block including a plurality of word lines. The method includes: performing an on-chip copy of data from a plurality of Single Level Cell (SLC) blocks of the non-volatile three-dimensional memory in a respective memory die to one Multilevel Cell (MLC) block of the non-volatile three-dimensional memory in the respective memory die by performing a set of operations. The method includes: (1) mapping source data from the plurality of SLC blocks to data groups, such that each data group includes pages of a predefined number of word lines of a respective SLC block of the plurality of SLC blocks, and (2) interleaving a copy of source data from a data group of a respective SLC block of the plurality of SLC blocks with a copy of source data from a data group of one or more other SLC blocks of the plurality of SLC blocks to produce interleaved source data. The interleaved source data includes a plurality of distinct sets of interleaved source data, and each source data copy that is interleaved is rotated by an offset assigned to the respective SLC block from which the source data is copied, and each respective SLC block in the plurality of SLC blocks is assigned a distinct offset. Finally, the method includes writing each distinct set of the interleaved source data to a distinct respective MLC page of the MLC block, including writing a first set of the interleaved source data to a first individual MLC page of the MLC block and writing a second set of the interleaved source data to a second individual MLC page of the MLC block, the first set having only non-parity data from the plurality of SLC blocks, and the second set having parity data from one SLC block (e.g., from only one SLC block) of the plurality of SLC blocks and non-parity data from one or more other SLC blocks of the plurality of SLC blocks.

(A2) In some embodiments, the method of A1, the writing includes writing a third set of the interleaved source data to a third individual page, the third set having parity data from two of SLC blocks of the plurality of SLC blocks and non-parity data from one or more other SLC blocks of the plurality of SLC blocks.

(A3) In some embodiments of the method of any of A1-A2, the respective memory die in the non-volatile three-dimensional memory includes three SLC blocks, the MLC block includes respective MLC pages, each respective MLC page of the MLC block including a lower page, middle page and upper page. Each distinct set of interleaved source data includes first, second and third pages of source data, including one page from each of the three SLC blocks, which are written to the lower page, the middle page and the upper page, respectively, of a corresponding MLC page of the MLC block.

(A4) In some embodiments of the method of A3, each SLC block of the three SLC blocks includes two pages of parity data, and the plurality of distinct sets of interleaved source data include two sets of interleaved source data that each include a distinct page of the two pages of parity data from a first SLC block of the three SLC blocks.

(A5) In some embodiments of the method of A4, the second set of the interleaved source data written to the second individual MLC page of the MLC block includes one of the two pages of parity data from the first SLC block of the three SLC blocks.

(A6) In some embodiments of the method of A4 or A5, the third set of interleaved data includes one of the two pages of parity data from the first SLC block of the three SLC blocks, stored at a first word line position in the first SLC block, and one of the two pages of parity data from a second SLC block of the three SLC blocks, stored at a second word line position in the second SLC block, wherein the second word line position is different from the first word line position.

(A7) In some embodiments of the method of any one of A1-A6, performing the on-chip copy includes copying data from 3P SLC blocks to N MLC blocks, where P is an integer greater than one, the 3P SLC blocks include P sets of 3 SLC blocks. The mapping, interleaving and writing is applied to each set of 3 SLC blocks to write interleaved source data to one MLC block. The 3P SLC blocks include 3 sets of P SLC blocks, each set of P SLC blocks includes 2P pages of parity data, and each of the 2P pages of parity data from a respective set of P SLC blocks is included in a distinct set of interleaved source data written to a distinct page of the P MLC blocks.

(A8) In some embodiments of the method of A7, the 3P SLC blocks and P MLC blocks are located in P or P/2 distinct memory die or P distinct memory planes, each having three SLC blocks of the 3P SLC blocks and one MLC block of the P MLC blocks.

(A9) In some embodiments of the method of any of A1 to A8, the one or more memory die comprise three-dimensional flash memory die, such as 3D NAND flash memory die.

(A10) In some embodiments of the method of any of A1-A2, the respective memory die includes four SLC blocks, the MLC block includes respective MLC pages, each respective MLC page of the MLC block including a lower page, lower-middle page, upper-middle page, and upper page, each distinct set of interleaved source data includes first, second, third and fourth pages of source data, including one page from each of the four SLC blocks, which are written to the lower page, the lower-middle page, the upper-middle page, and the upper page, respectively, of a corresponding MLC page of the MLC block.

(A11) In some embodiments of the method of A10, performing the on-chip copy includes copying data from 4P SLC blocks to 4 MLC blocks, where P is an integer greater than one, the 4P SLC blocks include P sets of 4 SLC blocks, and the mapping, interleaving and writing operations are applied to each set of 4 SLC blocks to write interleaved source data to one MLC block. Furthermore, the 4P SLC blocks include 8P pages of parity data, which are included in 5P distinct sets of interleaved source data by the interleaving, and each of the 5P distinct sets of interleaved source data include one or two pages of parity data from one or two SLC blocks of the 4P SLC blocks.

(A12) In some embodiments of the method of A10 or A11, the 4P SLC blocks and P MLC blocks are located in P or P/2 distinct memory die or P distinct memory planes, each having four SLC blocks of the 4P SLC blocks and one MLC block of the P MLC blocks.

(B1) In another aspect, a storage device includes one or more memory die, each memory die comprising a non-volatile three-dimensional memory having a plurality of blocks, each block including a plurality of word lines, one or more processors, and controller memory storing one or more programs, which when executed by the one or more processors cause the storage device to perform operations. The operations include performing an on-chip copy of data from a plurality of Single Level Cell (SLC) blocks of the non-volatile three-dimensional memory in a respective memory die to one Multilevel Cell (MLC) block of the non-volatile three-dimensional memory in the respective memory die by performing a set of operations includes (1) mapping source data from the plurality of SLC blocks to data groups, such that each data group includes pages of a predefined number of word lines of a respective SLC block of the plurality of SLC blocks, and (2) interleaving a copy of source data from a data group of a respective SLC block of the plurality of SLC blocks with a copy of source data from a data group of one or more other SLC blocks of the plurality of SLC blocks to produce interleaved source data. The interleaved source data includes a plurality of distinct sets of interleaved source data, and each source data copy that is interleaved is rotated by an offset assigned to the respective SLC block from which the source data is copied, and each respective SLC block in the plurality of SLC blocks is assigned a distinct offset. Finally, the set of operations includes writing each distinct set of the interleaved source data to a distinct respective page of the MLC block, including writing a first set of the interleaved source data to a first individual page of the MLC block and writing a second set of the interleaved source data to a second individual page of the MLC block, the first set having only non-parity data from the plurality of SLC blocks, and the second set having parity data from one SLC block of the plurality of SLC blocks and non-parity data from one or more other SLC blocks of the plurality of SLC blocks.

(B2) In some embodiments of the storage device of B1, the one or more programs include instructions that when executed by the one or more processors cause the storage system to perform the method of any of A1 to A12.

(B3) In yet another aspect, a non-transitory computer-readable storage medium stores one or more programs configured for execution by one or more processors of a storage device having non-volatile memory, including a non-volatile three-dimensional memory having a plurality of blocks, the one or more programs including instructions for causing the storage device to perform the method of any one of A1 to A12.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes called an information storage device, or a data storage device, or a memory device), which includes a storage controller 124 and a storage medium 130, and is used in conjunction with or includes a computer system 110 (e.g., a host system or a host computer).

In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices. In some embodiments, the memory cells of storage medium 130 are configured to store two or three bits per memory cell. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 includes one or more storage devices 120.

Computer system 110 is coupled to storage controller 124 through data connections 101. However, in some embodiments computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integrated device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices (e.g., NVM 134-1, NVM 134-2 through NVM 134-n) including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally, and/or alternatively, flash memory device(s) can also be configured for relatively smaller-scale applications such as personal flash drives or hard-disk replacements for personal, laptop, and tablet computers.

Memory devices (e.g., NVM 134-1, NVM 134-2, etc.) of storage medium 130 include addressable and individually selectable blocks, such as selectable portion 131 of storage medium 130 (also referred to herein as selected portion 131). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

In some embodiments, storage controller 124 includes a management module 121-1, a host interface 129, a storage medium Interface 128, and additional module(s) 125. Storage controller 124 may include various additional features that have not been illustrated for the sake of brevity and so as not to obscure pertinent features of the example embodiments disclosed herein, and a different arrangement of features may be possible.

Host interface 129 provides an interface to computer system 110 through data connections 101. Host interface 129 typically includes an input buffer and output buffer, not shown. Similarly, storage medium Interface 128 provides an interface to storage medium 130 though connections 103. In some embodiments, storage medium Interface 128 includes read and write circuitry, including circuitry capable of providing reading signals to storage medium 130 (e.g., reading threshold voltages for NAND-type flash memory).

In some embodiments, management module 121-1 includes one or more processing units 122-1 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, additional module(s) 125 and storage medium Interface 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

In some embodiments, additional module(s) 125 include an error control module, provided to limit the number of uncorrectable errors inadvertently introduced into data during writes to memory or reads from memory. In some embodiments, the error control module is executed in software by the one or more CPUs 122-1 of management module 121-1, and, in other embodiments, the error control module is implemented in whole or in part using special purpose circuitry to perform data encoding and decoding functions. To that end, in some embodiments, the error control module includes an encoder and a decoder. The encoder encodes data by applying an error control code to produce a codeword, which is subsequently stored in storage medium 130.

When the encoded data (e.g., one or more codewords) is read from storage medium 130, the decoder applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, an input buffer typically receives data to be stored in storage medium 130 from computer system 110. The data held in the input buffer is made available to the encoder, which encodes the data to produce one or more codewords. The one or more codewords are made available to storage medium interface 128, which transfers the one or more codewords to storage medium 130 in a manner dependent on the type of storage medium being utilized.

A read operation is initiated when computer system (host) 110 sends one or more host read commands (e.g., via data connections 101) to storage controller 124 requesting data from storage medium 130. Storage controller 124 sends one or more read access commands to storage medium 130, via storage medium interface 128, to obtain raw read data in accordance with memory locations (addresses) specified by the one or more host read commands. Storage medium interface 128 provides the raw read data (e.g., comprising one or more codewords) to the decoder. If the decoding is successful, the decoded data is provided to an output buffer, where the decoded data is made available to computer system 110. In some embodiments, if the decoding is not successful, storage controller 120 may resort to a number of remedial actions or provide an indication of an irresolvable error condition.

Figure 2:
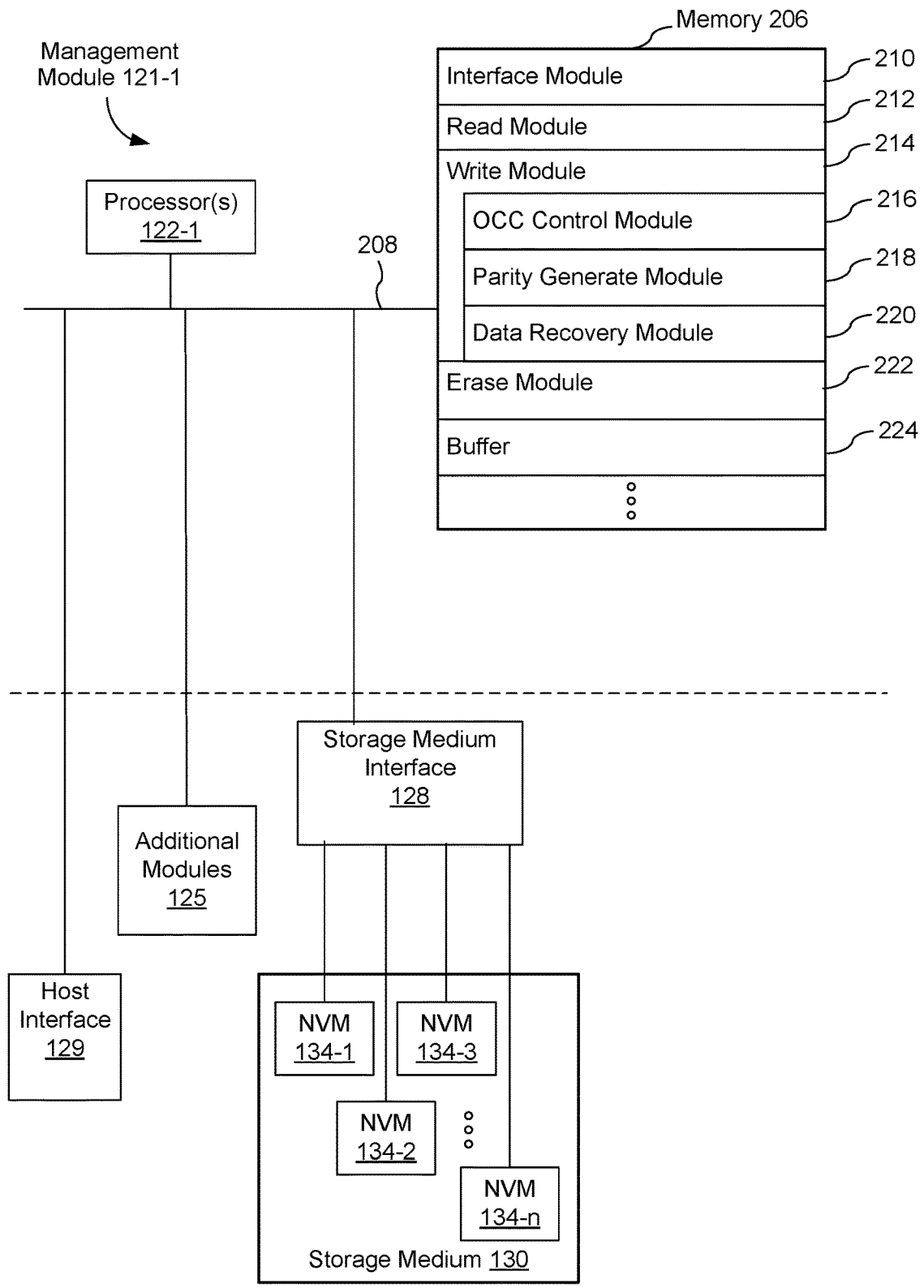
FIG. 2 is a block diagram illustrating a memory management module of a non-volatile memory controller, in accordance with some embodiments.

FIG. 2 is a block diagram illustrating an implementation of a management module 121-1, 121-2, (hereinafter management module 121 unless specifically designated otherwise), in accordance with some embodiments. Management module 121 typically includes one or more processing units 122-1 (sometimes herein called CPUs, processors, or hardware processors, and sometimes implemented using microprocessors, microcontrollers, or the like) for executing modules, programs and/or instructions stored in memory 206 and thereby performing processing operations, memory 206 (sometimes herein called controller memory), and one or more communication buses 208 for interconnecting these components. Communication buses 208 optionally include circuitry (sometimes called a chipset) that interconnects and controls communications between system components.

In some embodiments, such as those represented by FIGS. 1 and 2, management module 121 is coupled to host interface 129, additional modules 125, and storage medium interface 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices.

Memory 206 optionally includes one or more storage devices remotely located from processor(s) 122-1. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset or superset thereof:

- interface module 210 used for communicating with other components, such as non-volatile memory devices 134 and computer system 110;
- read module 212 used for reading from non-volatile memory devices 134;
- write module 214 used for writing to non-volatile memory devices 134; the write module contains several sub-modules including on-chip copy (OCC) control module 216 to control an OCC process, parity generate module 218 to generate parity data from source data stored in non-volatile memory devices 134, and data recovery module 220 to conduct a recovery process to recover data stored in non-volatile memory devices 134 using parity data stored in the non-volatile memory devices, as described in more detail below;
- erase module 222 used for erasing portions (e.g., selectable portion 131) of storage medium 130; and
- buffer 224 used for temporarily storing data, for example while reading, writing, copying (e.g., during an on-chip copy process), or recovering data.

Each of the above identified elements may be stored in one or more of the previously mentioned memory devices that together form memory 206, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 10A-10E.

Although FIG. 2 shows management module 121-1, FIG. 2 is intended more as a functional description of the various features that may be present in a management module, or non-volatile memory controller, than as a structural schematic of the embodiments described herein. In practice, and as recognized by those of ordinary skill in the art, items shown separately could be combined and some items could be separated. Further, as noted above, in some embodiments, one or more modules or sub-modules of management module 121-1 are implemented in management module 121-2 of computer system 110.

A single-level flash memory cell (SLC, also referred to as X1) stores one bit ("0" or "1"). Thus, the storage density of an SLC memory device is one bit of information per memory cell. A multi-level flash memory cell (MLC, sometimes referred to as X2), however, can store two or more bits of information per cell by using different ranges within the total voltage range of the memory cell to represent a multi-bit bit-tuple. In turn, the storage density of an MLC memory device is multiple-bits per cell (e.g., two bits per memory cell). A triple-level memory cell (TLC, also referred to as X3) has eight possible states per cell, yielding three bits of information per cell; and a quadruple-level memory cell (sometimes referred to as QLC or X4 memory cells) has 16 possible states per cell, yielding four bits of information per cell. However, it is noted that sometimes the term "MLC" is used herein to refer to flash memory cells that store two or more bits per cell.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, typically mean the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1," and otherwise the raw data value is a "0."

Figure 3:
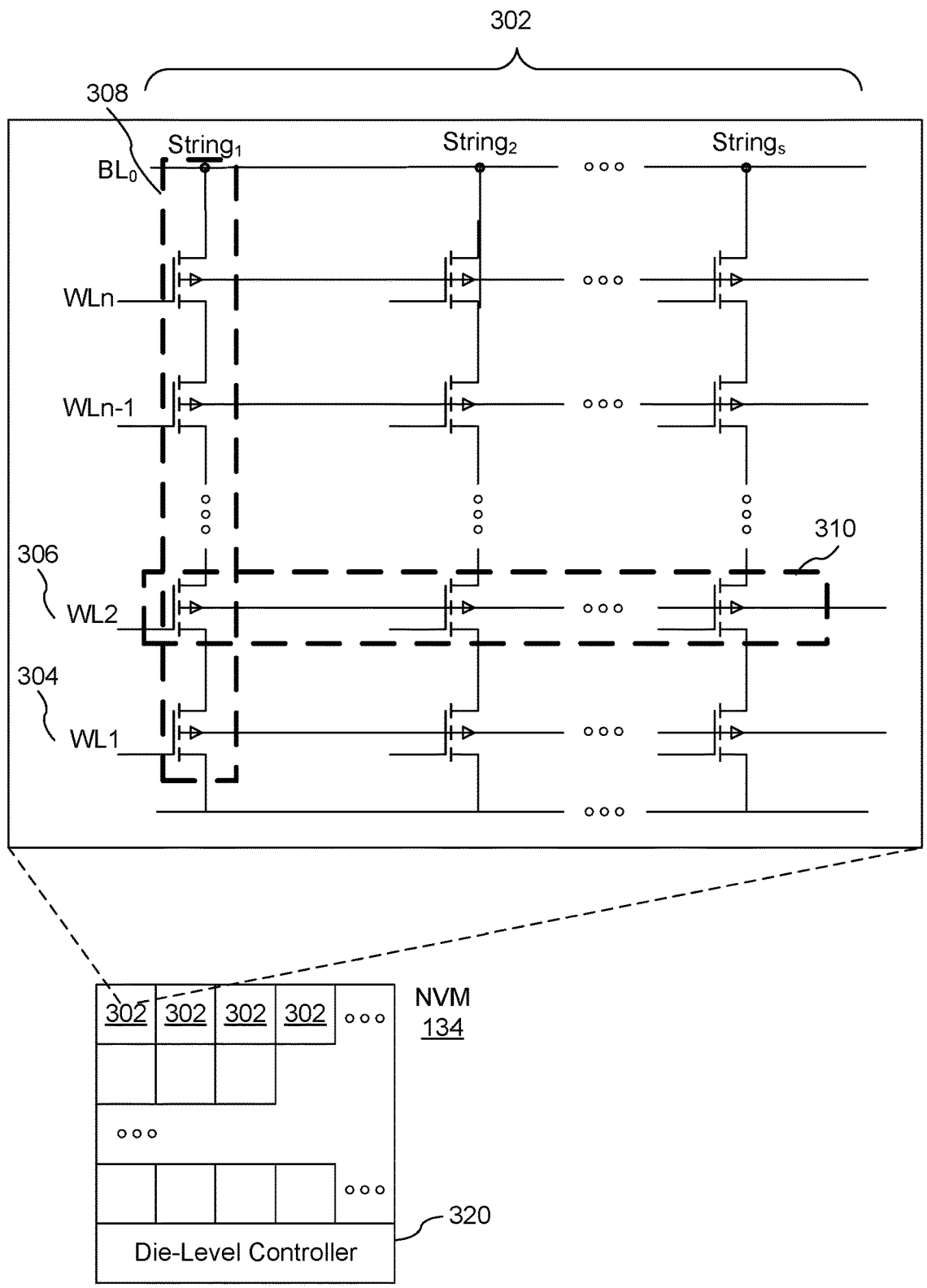
FIG. 3 is a simplified diagram of a three-dimensional non-volatile memory array in accordance with some embodiments.

FIG. 3 is a simplified diagram of a three-dimensional non-volatile memory array 302, sometimes herein called a block or non-volatile memory block or 3D block, in accordance with some embodiments. Array 302 includes orthogonal word lines, strings, and bit lines. The number of word lines in array 302 varies from implementation to implementation, and is 48 in the example shown in FIG. 3. The set of word lines in array 302 form a contiguous set. For example, word lines 1 (WL1) through n (WLn) are a contiguous set of word lines in array 302. Array 302 includes S strings denoted String$_1$ 308 to Strings, and further includes bit lines, one of which is shown in FIG. 3, and others of which are above or below the page (e.g., page 310) or plane of memory cells shown in FIG. 3. Stated another way, array 302 includes multiple parallel planes of memory cells, one of which is shown in FIG. 3, and the others of which are above and/or below the plane shown in FIG. 3. Typically, all the memory cells (e.g., on B bit lines) corresponding to a specified word line and string (in a specified memory block), are accessed in parallel, thereby accessing one or more pages of data in a single memory access operation. Die-level controller 320 controls the OCC process at the chip or plane level.

A physical page, such as page 310, is a group of memory cells enabled to be sensed or programmed in parallel. This is accomplished by a corresponding page of sense amplifiers (not shown). The sensed results are latched in a corresponding set of latches (not shown). Each sense amplifier can be coupled to a string via a bit line. Page 310 is enabled by the control gates of the cells of the page connected in common to a word line (e.g., WL2) and each cell accessible by a sense amplifier accessible via a bit line. As an example, when respectively sensing or programming the page of cells, a sensing voltage or a programming voltage is respectively applied to the common word line together with appropriate voltages on the bit lines. In some embodiments, only one string of each memory block can be accessed at any one time, and in such embodiments a physical page is the group of memory cells (e.g., equal in number to the number of bit lines) on one string connected in common to a word line. More generally, in this document, the term "logical word line" denotes the group of memory cells, on a single string, connected in comment to a word line. In an MLC block, each logical word line stores two or more (e.g., three) pages of data or parity data, and each logical word line of the MLC block is sometimes herein called an MLC page, while in an SLC block, each logical word line stores one page of data or parity data, and each logical word line of the SLC block is sometimes herein called an SLC page. It is noted that the terms "SLC page" and "MLC page" describe a unit of physical memory media, typically sufficient to store a particular amount of data, such as (without limitation) 4, 8 or 16 kilobytes for an SLC page, or 12, 24 or 48 kilobytes for an MLC page, while a "page of data" or "page of parity data" or "parity data page" is a quantity of data.

Figure 4:
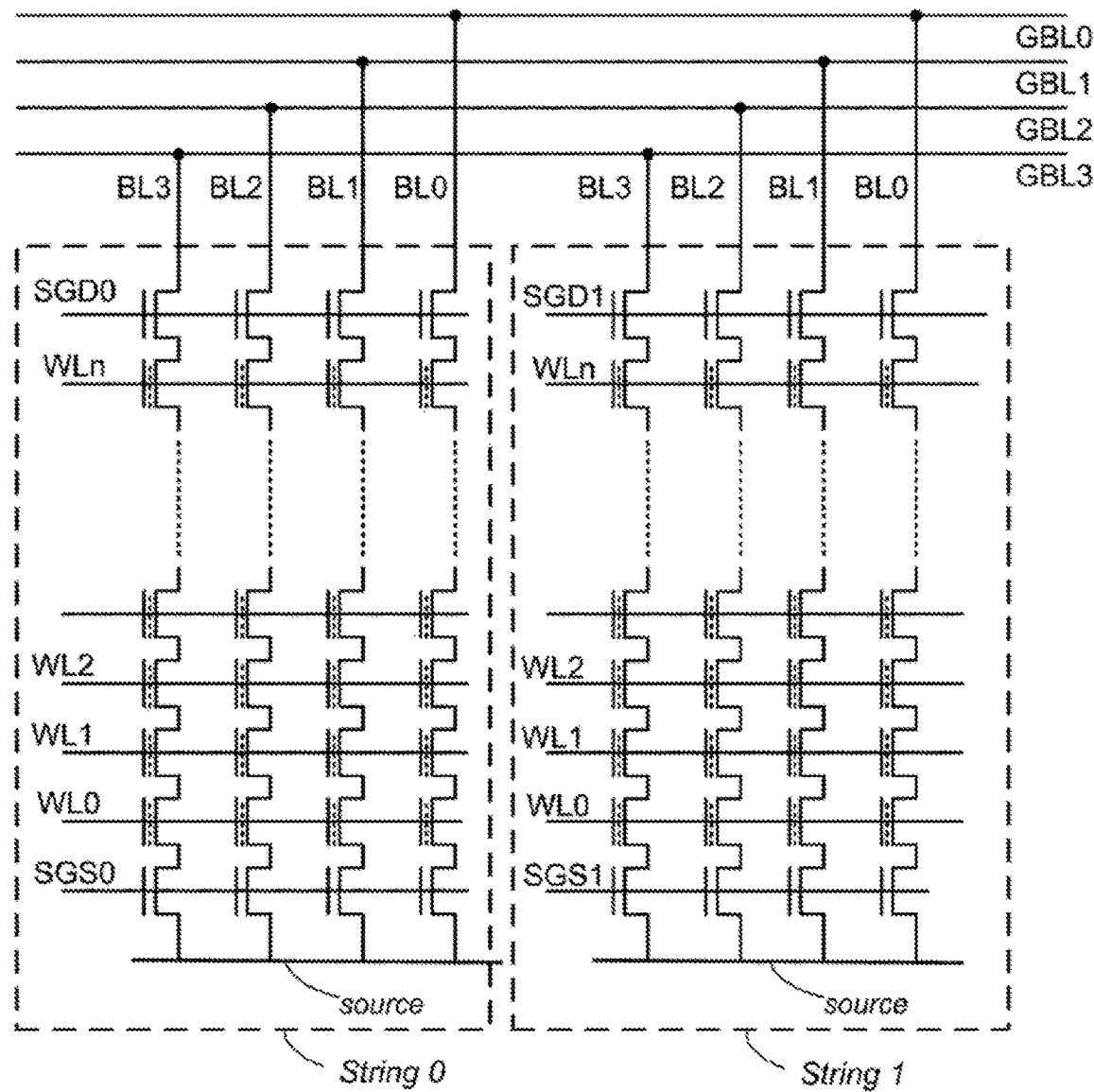
FIG. 4 illustrates schematically separately-selectable sets of NAND strings in accordance with some embodiments.
Figure 4:
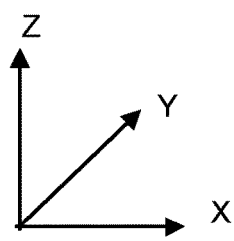

FIG. 4 illustrates schematically separately-selectable sets of NAND strings in accordance with some embodiments. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductor underlying a block. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

Figure 5:
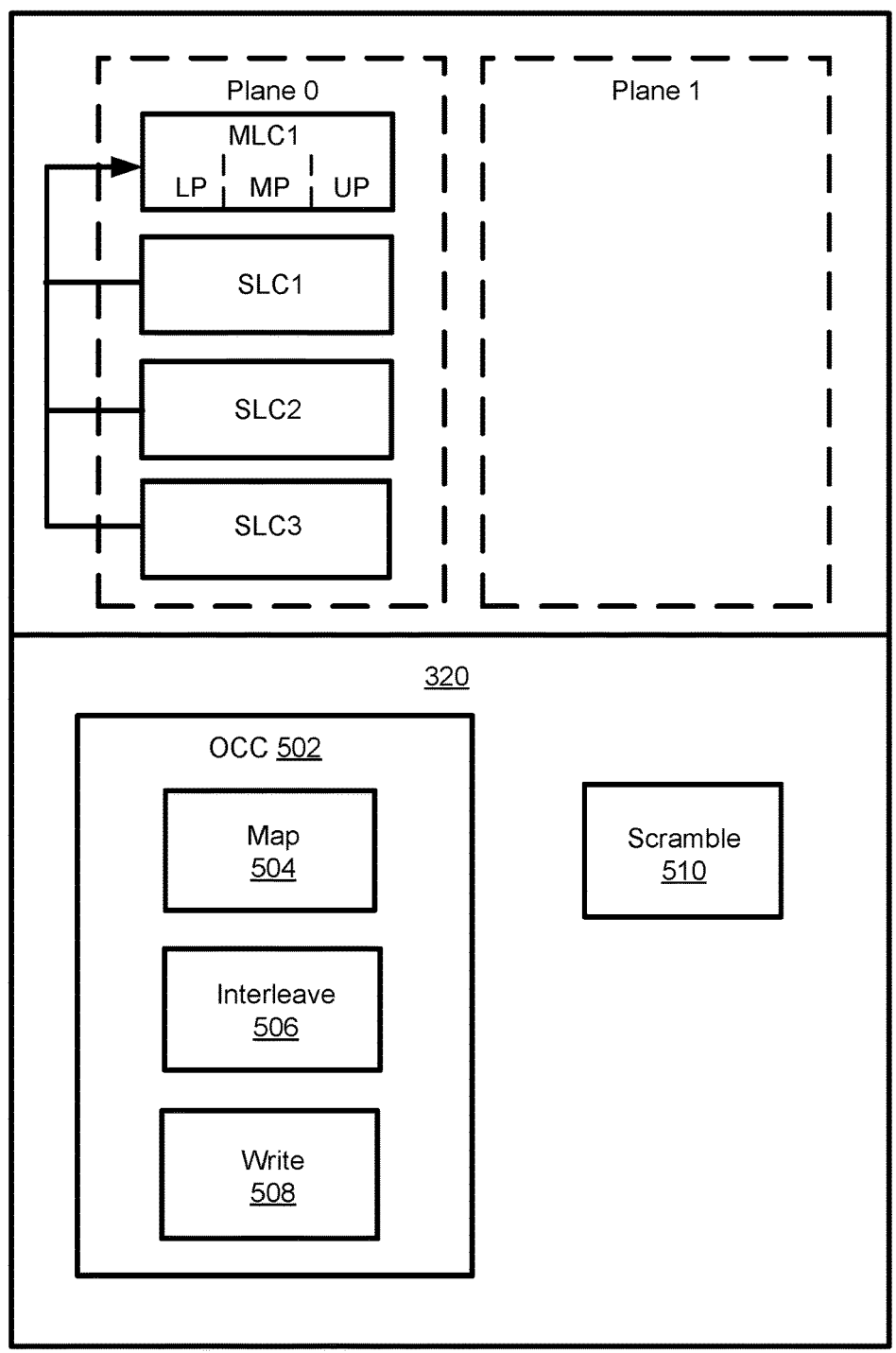
FIG. 5 is a simplified block diagram illustrating non-volatile memory 134 in accordance with some embodiments.

FIG. 5 is a simplified block diagram illustrating non-volatile memory 134 in accordance with some embodiments. Non-volatile memory 134 includes one or more three-dimensional memory dies, of which just one is shown in FIG. 5. For example, each of the three-dimensional memory dies includes multiple individually erasable blocks that are arranged in two memory planes, plane 0 and plane 1, each having three SLC blocks (e.g., SLC1, SLC2, and SLC3), at least one MLC block (e.g., MLC1), and die-level controller 320. In some embodiments, each memory die includes a much larger number of MLC blocks than SLC blocks, for example at least five times, or ten times as many MLC blocks as SLC blocks. In some embodiments, each memory die includes three or six SLC blocks, where each set of three SLC blocks is used as a write buffer, and two (or more) different sets of SLC blocks are used in alternating or rotating fashion, so that data is written to one set of SLC blocks as an on-chip copy operation (OCC) is performed on the data written to another set of SLC blocks.

In some embodiments, an instance of die-level controller 320 is included in each memory plane. In each memory plane, some blocks are operated as SLC blocks while others are operated as MLC blocks. Each MLC block includes a multi-level page corresponding to each distinct word line—string pair. Thus, if the MLC block as 48 word lines and 4 strings, the MLC block has 192 multi-level pages. If the MLC block is a TLC block, the TLC block is configured to store three pages of data (e.g., lower page, also referred to as LP, middle page, also referred to as MP, and upper page, also referred to as UP) in each multi-level page of the MLC block. Taking the viewpoint that each string in a block has a separate set of word lines (even if those word lines are coupled to the word lines of the other strings in the MLC block), multi-level pages are sometimes called word lines or words, to avoid confusion with the multiple pages of data stored in each multi-level page.

In some embodiments, die-level controller 320, in response to a write command received from storage controller 120 (FIG. 1), is configured to initially write data in SLC format (one bit per memory cell) in SLC blocks and subsequently to copy the data in the SLC blocks to one or more MLC blocks, depending on the number of SLC blocks that have been filled with data. In some embodiments, copying data (also called data folding or folding data) from multiple SLC pages into an MLC page is performed as a background operation so that write performance of the non-volatile memory 134 is not affected. The sources (also referred to as copy sources) in SLC blocks and the target (also referred to as copy target) in an MLC block for an on-chip copy operation are identified in some embodiments by die-level controller 320 and in some other embodiments by OCC control module 216 of the storage controller 120 (see FIGS. 1 and 2).

Data folding may be performed in data units that correspond to multiple word lines of an MLC block. A minimum unit of data folding may be also referred to as a "data-set." In some embodiments, the OCC control module 216 of storage controller 120, or the die-level controller 320, determines, on a data-set by data-set basis, whether folding should be performed. In some embodiments, folding is performed so that each data-set is contained in one separately selectable set of NAND strings in an MLC block (MLC1).

In some embodiments, die-level controller 320 (FIG. 3) includes OCC module 502 and scramble module 510. OCC module 502 is configured to perform an on-chip copy of data from one portion of memory within a respective memory chip to another portion of memory within the same respective memory chip. For example, OCC module 502 may perform the folding on data from a set of SLC blocks (e.g. SLC1-SLC3 of plane 0) into an MLC block (e.g. MLC1 of plane 0), thereby keeping the folded data within a single semiconductor die or plane during performance of the data folding operation (i.e., on-chip copying operation).

In some embodiments, OCC module 502 includes mapping module 504, interleave module 506, and write module 508. In some embodiments, the functions of mapping module 504 and interleave module 506 are combined in a single module. In some embodiments, each on-chip copy operation by OCC module 502 is initiated in response to an instruction from OCC control module 216. Mapping module 504 included in OCC module 502 may be executed by OCC control module 216. In such a case, OCC control module 216 may identify a copy source and a copy target in memory die or memory plane and transmit information identifying the copy source and the copy target to OCC module 502. After OCC module 502 receives the information identifying the copy source and copy target, OCC module 502 may start OCC process based on the received copy source and copy target.

Mapping module 504 is configured to map or allocate source data from a plurality of SLC blocks to data groups, such that each data group includes pages (i.e., the data in pages) from a predefined number of word lines of a respective SLC block of the plurality of SLC blocks. Data stored in SLC blocks is sometimes referred to as "source data."

Interleave module 506 is configured to interleave a copy of source data from a data group of a respective SLC block of the plurality of SLC blocks with a copy of source data from a data group of one or more other SLC blocks of the plurality of SLC blocks to produce interleaved source data. The source data of a data group, which is interleaved with source data of one or more other data groups, is rotated by an offset assigned to the respective SLC block from which the source data is copied, and each respective SLC block in the plurality of SLC blocks is assigned a distinct offset. Thus, interleave module 506 may rotate pages in the source data for mitigation of scrambling issues occurring in case that the input page number is the same for all pages of the MLC block.

Write module 508 is configured to write each distinct set of the interleaved source data (e.g., 3 SLC pages of source data) to a distinct respective page of the MLC block (e.g., where one MLC page of the MLC block has the capacity to store source data from 3 SLC pages). As will be described in more detail below with reference to FIGS. 7 and 9, the sets of data written to the MLC block include a first set and/or a second set, where the first set has only non-parity data from the plurality of SLC blocks, and the second set has parity data from one SLC block of the plurality of SLC blocks and non-parity data from one or more other SLC blocks of the plurality of SLC blocks.

In some embodiments, write module 508 writes a third set of the interleaved source data to a third individual page of the MLC block. The third set has parity data from two SLC blocks of the plurality of SLC blocks and non-parity data from one or more other SLC blocks of the plurality of SLC blocks.

Die-level controller 320 optionally includes scramble module 510, which is configured to perform scrambling of data that is read from SLC blocks prior to writing the data to an MLC block. In some embodiments, scramble module 510 uses a set of scramble keys or scramble patterns to scramble every data-set that is copied from SLC blocks to one or more MLC blocks, and also uses the scramble keys or scramble patterns (or inverse version thereof) to descramble data read from MLC blocks. In some embodiments, the data scrambling and descrambling performed by scramble module 510 is separate from the data rotations performed by interleave module 506, and thus can be configured to address different data storage and integrity issues than the data storage and integrity issues addressed by OCC module 502 and OCC control module 216 (FIG. 2).

Figure 6:
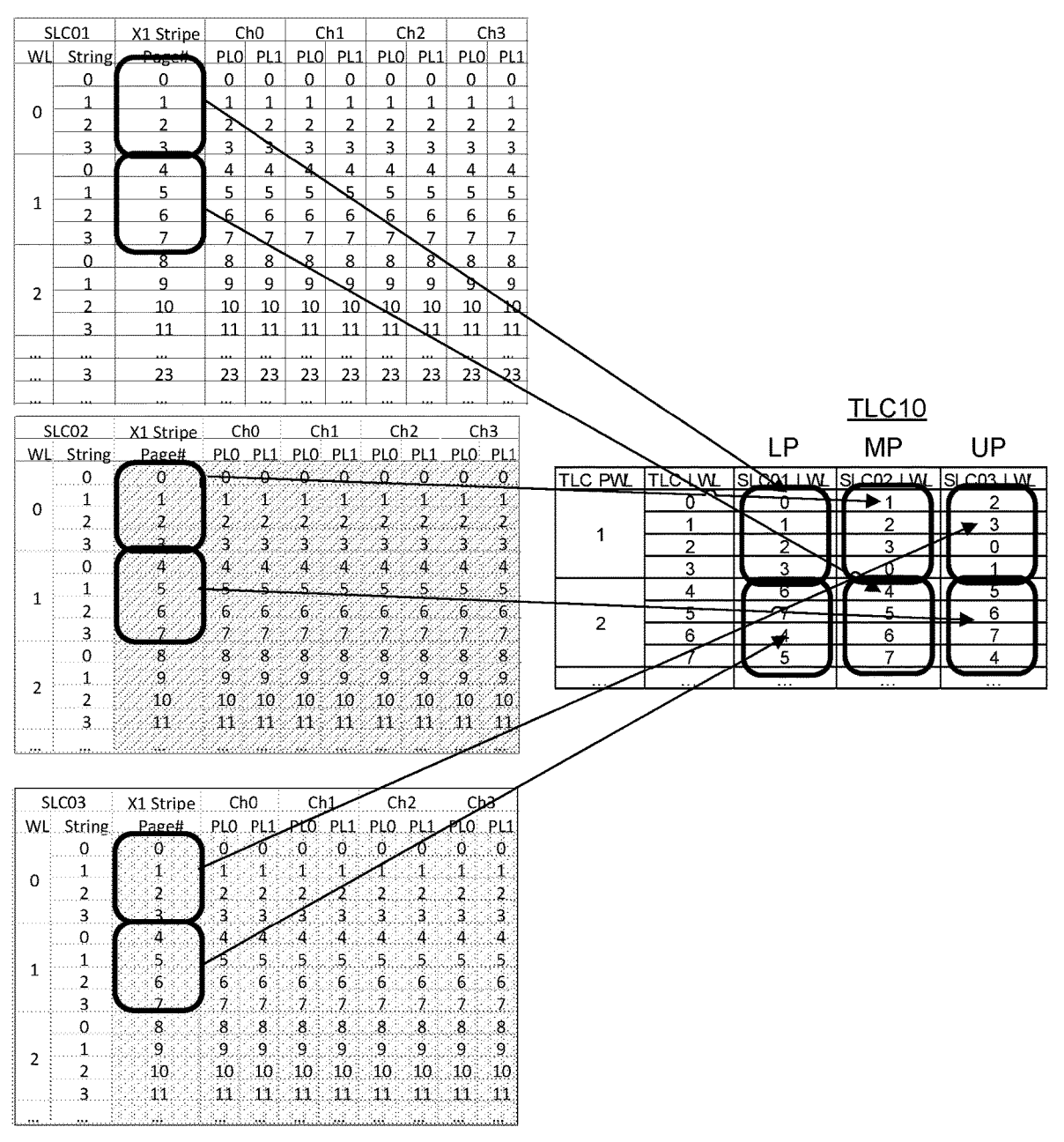

FIG. 6 illustrates an example of source data from three SLC superblocks that is rotated and interleaved for writing to one MLC superblock, in accordance with some embodiments. In this example, each SLC superblock (SLC01, SLC02, SLC03) includes eight SLC blocks, located in four chips (Ch0-CH3, with two memory planes (PL0 and PL1) in each chip, for a total of P=8 distinct memory planes across the four chips, where chips are sometimes herein called die (as in memory die). As shown in FIG. 6, in some embodiments, the non-volatile three-dimensional memory includes three SLC superblocks (labeled SLC01, SLC02, SLC03) and an MLC superblock (labeled TLC10). The MLC superblock includes respective multi-level pages, also herein called MLC pages, each respective multi-level page of the MLC superblock including, in this example, a lower page (LP), middle page (MP) and upper page (UP), for storing three bits of data per memory cell and three pages of data per MLC logical word line (MLC is sometimes herein called TLC, since three bits are stored per memory cell in this example).

In the example shown in FIG. 6, each distinct set of interleaved source data includes three pages of source data, including one page from each of the three SLC superblocks. The three pages of source data are written to the lower page, the middle page and the upper page (i.e., a different page of source data is written to each of the three pages) of a corresponding multi-level (MLC) page of the MLC superblock. In this example, each multi-level page in the MLC superblock has a corresponding TLC logical word line (TLC LWL), and four multi-level pages are included in each physical word line (TLC PWL) of the MLC superblock as shown. In some embodiments, each multi-level page of the MLC superblock corresponds to a distinct string in the MLC superblock, as shown in FIGS. 3 and 4.

A data mapping scheme is applied to map data from the SLC superblocks to the MLC superblock, so that data stored in each logical word line (i.e., multi-level page) of the MLC superblock comes from different logical locations (or locations with different offsets) in the source data SLC superblocks. For the sake of brevity, in FIGS. 6-9 and 10A-10B, copied data in each MLC superblock is identified using corresponding page numbers of the source data in the SLC superblocks (e.g., copied data from page 0 is identified with a "0" in FIG. 6). In the example shown in FIG. 6, source data of pages 0-3 of word line 0 (WL0) of a first SLC superblock (SLC01) are allocated to the lower pages of logical word lines 0-3 of a first physical word line (TLC PWL 1) of an MLC superblock (TLC10). Source data of pages 0-3 of word line 0 (WL0) of a second SLC superblock (SLC02) are allocated to the middle pages of logical word lines 0-3 of the first physical word line (TLC PWL 1) of the MLC superblock (TLC10). Source data of pages 0-3 of word line 0 (WL0) of a third SLC superblock (SLC03) are allocated to the upper pages of logical word lines 0-3 of the first physical word line (TLC PWL 1) of the MLC superblock (TLC10).

Further, in the example shown in FIG. 6, each source data copy, in addition to being interleaved with the other source data copies, is rotated by an offset assigned to the respective SLC superblock from which the source data is copied. For example, the offset of SLC01 is 0, the offset of SLC02 is 1, and the offset of SLC03 is 2. Thus, as shown in FIG. 6, source data copies of pages 0-3 of word line 0 of SLC01 are written to the lower pages of logical word lines 0-3 in a physical word line 1 (PWL 1) of an MLC superblock (TLC10), without rotation; source data copies of pages 0-3 of word line 0 of SLC02 are written to the middle pages of logical word lines 3 and 0-2 of physical word line 1 of the MLC superblock, respectively, with a rotation offset of 1; and source data copies of pages 0-3 of word line 0 of SLC03 are written to the upper pages of logical word lines 2-3 and 0-1 of physical word line 1 of the MLC superblock, respectively, with a rotation offset of 2. Similarly, pages from a new word line, word line 1, in each of the three SLC superblocks are written to a next physical word line, PWL 2, of the MLC superblock (TLC10), with the same rotation offsets. However, in some embodiments source data copies from a respective SLC superblock (e.g., SLC01) that are written to adjacent physical word lines in the MLC superblock are written to different page labels in the adjacent physical word lines of the MLC superblock. In the example in FIG. 6, source data copies for word line 1 of the SLC superblocks are further rotated to different "page levels" in physical word line PWL 2 relative to the page levels to which source data copies are written in the adjacent (prior) physical word line PWL 1. In particular, source data copies from the first SLC superblock SLC01 are written to the middle pages of physical word line 2 of the MLC superblock, source data copies from the second SLC superblock SLC02 are written to the upper pages of physical word line 2 of the MLC superblock, and source data copies from the third SLC superblock SLC03 are written to the lower pages of physical word line 2 of the MLC superblock.

It is noted that the data interleaving and rotating patterns, described above with reference to FIG. 6, for copying data from a set of SLC superblocks to one MLC superblock, are also applicable to the SLC and MLC blocks within each memory die, and even each memory plane (e.g., data from three SLC blocks in a single memory die or memory plane are interleaved, rotated, and written to one MLC block in the same memory die or memory plane). In FIG. 6, the four "chips" (Ch0 through Ch3) are memory die, and the example in FIGS. 6 and 7 shows three SLC blocks and one MLC block for each memory plane of each memory die (e.g., on the left side of FIG. 6, the vertical stripe of SLC pages corresponding to Ch0, PL0, includes three SLC pages, which will be copied into a corresponding MLC page, shown in FIG. 7 as the set of MLC pages for memory die Ch0 and memory plane PL0).

FIG. 7 illustrates an example of source data folded from three SLC superblocks (not shown, but corresponding to the three SLC superblocks shown in FIG. 6), each of which contains eight SLC blocks (i.e., 24 SLC blocks, not shown) to one MLC superblock, which contains eight MLC blocks divided over four chips (sometimes called die) (Ch0, Ch1, Ch2 and Ch3), with two planes (PL0 and PL1) per chip, in accordance with some embodiments. Each MLC block corresponds to a set of three adjacent columns (e.g., LP, MP, UP) of Ch0, PL0) in FIG. 7. In the example shown in FIG. 7, source data copied from each set of three SLC superblocks to one MLC superblock are interleaved and rotated in the same way as the example of FIG. 6. Sub-data group 702, also herein called a parity data group, is a set of parity data copied from a first SLC block in a first superblock (in a set of three SLC superblocks), SLC01; sub-data group 704 is a set of parity data copied from a second SLC block in a second SLC superblock; and sub-data group 706 is a set of copied parity data from a third SLC block in a third SLC superblock. Since the three SLC superblocks in the set have different rotation offsets, the parity data copied from the three SLC superblocks are at different logical word line positions in each of the MLC blocks in the MLC superblock, as shown in FIG. 7. The pattern of rotated source data copies, and source data copy offsets, is repeated in each of the eight MLC blocks of the MLC superblock shown in FIG. 7. Thus, there is a parity data group 702 in the lower pages of two MLC pages in each of the eight MLC blocks, a second parity data group 704 in the middle pages of two MLC pages in each of the eight MLC blocks, and a third parity data group 706 in the upper pages of two MLC pages in each of the eight MLC blocks.

In the examples shown in FIGS. 7, 8, and 9, the last two pages (e.g., pages 254 and 255) of each SLC superblock contain parity data. However, in other embodiments, parity data may be stored in other pages, or at different offsets, within the SLC superblocks. In FIGS. 7 and 9, source parity data from a set of SLC superblocks is shown to have been rotated and interleaved using the same pattern of rotations and interleaving as non-parity data. However, in the example shown in FIG. 9, and additional level of protection for parity data is provided, as described in more detail below.

The copied data in the MLC blocks shown in FIG. 7 includes a plurality of distinct sets of interleaved source data. In this example, the copied data in the MLC blocks (e.g., in the logical word lines of the MLC blocks) includes three types of distinct sets (e.g., first sets, second sets and third sets). The first sets each have only non-parity data from the SLC blocks. For instance, copied data of logical word lines 0-3 (TLC LWL 0-3) are included in a first set. In the example shown in FIG. 7, the copied data in logical word lines 0-251 (TLC LWL 0-251) for sixty-three sets of interleaved source data of the first type (only non-parity data). Each of the second sets has parity data from one SLC block or superblock of a plurality of SLC blocks or superblocks and non-parity data from one or more other SLC blocks or superblocks of the plurality of SLC blocks or superblocks. For instance, copied data in logical word lines 252 and 255 (TLC LWL 252 and 255), of a single MLC block, are included in one instance of a second set. Each third set has parity data from two SLC blocks or superblocks of a plurality of SLC blocks or superblocks, and non-parity data from one or more other SLC blocks or superblocks of the plurality of SLC blocks or superblocks. For instance, copied data in logical word lines 253 and 254 (TLC LWL 253 and 254) are included in an instance of a third set.

As shown in the examples of FIGS. 6 and 7, map module 504 maps or assigns source data from the three SLC superblocks (e.g., SLC01, SLC02 and SLC03 in FIG. 6) to data groups, each of which is mapped, in turn, to a physical word line of an MLC block. For example, a respective data group includes four pages (e.g., pages 0-3 or 4-7 in FIG. 6) that are copied from a single word line (e.g., the same word line, in each of four strings) of a respective SLC superblock of the three SLC superblocks (e.g., SLC01, SLC02 and SLC03).

Interleave module 506 interleaves a copy of source data from a data group of a respective SLC superblock (e.g., SLC01) of the three SLC superblocks with a copy of source data from a data group of one or more other SLC superblocks (e.g., SLC02 and/or SLC03) of the three SLC blocks to produce interleaved source data. For example, the interleaved source data includes the aforementioned three distinct sets (e.g., the first set, the second set and the three set).

Write module 508 writes each distinct set of the interleaved source data to a distinct respective page, or logical word line (e.g., TLC LWL 0, 1, 2, ..., or 255) of the MLC superblock, TLC10. The write module 508 may write a first set, which includes only non-parity data, of the interleaved source data to a first individual page (e.g., TLC LWL 0, 1, ..., or 251 in FIG. 7) of TLC10. Write module 508 may write a second set, which includes parity data from one SLC block (e.g., SLC01) and non-parity data from one or more other SLC superblocks (e.g., SLC02 and/or SLC03), of the interleaved source data to a second individual page (e.g., TLC LWL 252 or 255 in FIG. 7) of TLC10. Write module 508 may write a third set, which includes parity data from two of SLC superblocks (e.g., SLC01 and SLC02, or SLC02 and SLC03, or SLC03 and SLC01) and non-parity data from one or more other SLC superblocks (e.g., SLC03, or SLC01, or SLC02), of the interleaved source data to a third individual page (e.g., TLC LWL 253 or 254 in FIG. 7).

FIG. 8 illustrates an example of the distribution and organization of non-parity data and parity data in a single SLC superblock (e.g., one of the three SLC superblocks shown in FIG. 6), which includes eight SLC blocks distributed over four chips (Ch0, Ch1, Ch2, Ch3), with two planes per chip, in accordance with some embodiments. In this example shown in FIG. 8, the last two word lines, corresponding to pages 254 and 255, in each SLC block in the SLC superblock store parity data. In this example, the data in the eight SLC blocks is organized into eight data sets, sometimes called parity groups, 0 to 7, and parity data is generated and stored for each parity group. Non-parity data is stored in page numbers 0 to 253 of each SLC block, and parity data is stored in page numbers 254 and 255 of each SLC block. In other examples, the parity data could be stored in any two pages of each SLC block, so long as the location of the parity data is predefined. The labels in FIG. 8 for pages 0 to 253 indicate the parity group to which data in each of the pages is assigned. In this example, all data in pages 0, 8, 16, 24, ... 248 are assigned to parity group 0; all data in pages 1, 9, 17, 25, ... 249 are assigned to parity group 1; etc. Furthermore, two copies of the parity data for each parity group, 0 to 7, are stored in the eight SLC blocks, with each SLC block storing parity data for two different parity groups. The parity data for a parity group is sometimes called a parity data word, and is stored in a page of an SLC block. For this reason, parity data words are sometimes called pages of parity data, although in some embodiments the size of the parity data for a parity group could be larger than one page, and thus in those embodiments a parity data word would have a size of R pages, where R is an integer greater than one.

Forward parity data, for parity groups 0 to 7, are stored in parity data set 802, in page 254 of the eight SLC blocks, and so-called reverse parity data, for parity groups 7 to 0, are stored in parity data set 804, in page 255 of the eight SLC blocks. The reverse parity data is identical to the forward parity data, but stored in different SLC blocks than the forward parity data, as shown in FIG. 8. As a result, if a parity data word in forward parity set 802 is corrupted or become unreadable, the other copy of the same parity word in reverse parity set 804 can be used. Furthermore, by storing two copies of the parity data for each set of data, and storing each copy in a different SLC block, when the SLC source data in a set of SLC superblocks is copied to an MLC superblock, as shown in FIG. 9, the storage integrity of the parity data is improved by copies of the parity data being stored in different MLC blocks, in different chips, and at different page levels.

In some embodiments, each SLC superblock has N (e.g., eight) parity groups and N corresponding parity data words (e.g., N pages of parity data), one example of which is shown in FIG. 8. In some embodiments, when M (e.g., three) SLC superblocks are copied, using OCC, to an MLC superblock, the resulting copied data has M×N (e.g., twenty-four) distinct parity data words to protect the copied data. For example, in some embodiments, for each data group i (e.g., each of groups 0 to 7, shown in FIGS. 6, 7, 8 and 9) all the non-parity data in group i (e.g., any of groups 0 to 7) in each individual SLC superblock (of the M SLC superblocks) is combined (e.g., using XOR or other predefined error detection or error correction code generation) to produce a single parity word for that group for that SLC superblock, thereby producing M×N parity data words. However, in some other embodiments, parity data from the M SLC superblocks are combined (e.g., using XOR or other predefined error detection or error correction code generation), producing N parity data words that are used to protect all the copied data in the MLC superblock. For example, in some embodiments, for each data group i (e.g., each of groups 0 to 7, shown in FIGS. 6, 7, 8 and 9) all the non-parity data in group i (e.g., any of groups 0 to 7), across all three SLC superblocks, is combined (e.g., using XOR or other predefined error detection or error correction code generation) to produce N (e.g., 8) parity words, one for each of the N data groups.

In yet other embodiments, the data in each SLC block is protected by one page of parity data, stored at a predefined word line position in the SLC block. In such embodiments, if data is initially written to a set of M×N SLC blocks (e.g., 3 SLC superblocks, or 24 SLC blocks), the number of distinct pages of parity data is M×N (e.g., 24 in the above example). In some embodiments, each SLC block stores two pages of parity data, one comprising parity data for that SLC block and the other comprising parity data for another SLC block in the same memory die (e.g., an SLC block in a different memory plane of a memory die having two memory planes).

FIG. 9 illustrates an example of the distribution and organization of non-parity data and parity data in an SLC superblock, after it has been copied from three SLC superblocks, one of which is shown in FIG. 8, and all three of which are shown in FIG. 6, into one MLC superblock, in accordance with some embodiments. FIG. 9 has three columns, representing the lower (LP), middle (MP) and upper (MP) pages of the eight MLC blocks in the MLC superblock. As shown in FIG. 9, in this example, an additional level or type of data rotation is used to further protect the parity data in the MLC superblock. This additional level or type of data rotation is also shown in FIG. 7. Group 702 in FIG. 7 corresponds to parity data group 902 in FIG. 9, group 704 in FIG. 7 corresponds to parity data group 904 in FIG. 9, and group 706 in FIG. 7 corresponds to parity data group 906 in FIG. 9. Each of the parity data groups 902, 904 and 906 includes both forward parity copies (e.g., 0 to 7) and reverse parity copies (e.g., 7 to 0) of the N (e.g., 8) parity data words. To provide additional protection to the parity data in the MLC superblock, six copies each parity data word are stored, with two copies of each parity data word stored in the lower pages, two copies of each parity data word stored in the middle pages. and two copies of each parity data word stored in the upper pages of the MLC superblock.

As described above with reference to FIGS. 6 to 9, in some embodiments, each SLC block (e.g., an SLC block of PL0 of Ch0 in FIG. 8) of the three SLC blocks for which data is being copied to an MLC block, includes two pages (e.g., page 254 and 255 of PL0 of Ch0 in FIG. 8) of parity data (e.g., pages labelled "0" and "7" in parity data sets 802 and 804, FIG. 8), and the plurality of distinct sets of interleaved source data (e.g., as shown in FIG. 6, the data to be copied to each logical word line (LWL) in an MLC block (e.g., TLC10) is a distinct set of interleaved source data) include two sets of interleaved source data that each include a distinct page of the two pages of parity data from a first SLC block of the three SLC blocks. For example, in FIG. 7, the two sets of interleaved source data to be written to logical word lines 254 and 255 of MLC block TLC10, chip Ch0, memory plane PL0, each include one page of parity data from a first SLC block (e.g., SLC01, FIG. 6), as indicated by parity data group 702. Furthermore, one of those two sets of interleaved source data, to be written to logical word line 254 of MLC block TLC10, chip Ch0, memory plane PL0, includes one page of parity data from the first SLC block, as indicated by parity data group 702, and one page of parity data from a second SLC block (e.g., SLC02, FIG. 6), as indicated by parity data group 704.

In some embodiments, and in this example, the set of interleaved source data to be written to logical word line 254 of MLC block TLC10, chip Ch0, memory plane PL0, also includes one page of non-parity data from a third SLC block (e.g., SLC03, FIG. 6). Similarly, a third set of interleaved source data, to be written to logical word line 253 of MLC block TLC10, chip Ch0, memory plane PL0, includes one page of parity data from the second SLC block, as indicated by parity data group 704, one page of parity data from the third SLC block, as indicated by parity data group 706, and one page of non-parity data from the first SLC block.

Furthermore, in some embodiments, the two pages of parity data included in any respective set of interleaved source data, are stored a distinct first and second word line positions in the source SLC blocks. For example, for the set of interleaved source data to be written to logical word line 254 of MLC block TLC10, chip Ch0, memory plane PL0, the parity data from the first SLC block is stored at a first word line position (e.g., a word line offset from a first word line), 254, and the parity data from the first SLC block is stored at a second word line position, 255, that is different from the first word line position. These different word line positions are due to the different rotation offsets assigned to the respective SLC blocks, and the resulting intermixing of parity data from the different SLC blocks helps to protect against failure modes that might otherwise result in a loss of all copies of the parity data for one or more data groups.

In some embodiments, each page of the two pages of parity data in the first SLC block (as well as each of the other SLC blocks) is generated from data in multiple SLC blocks, such as the eight SLC blocks shown in FIG. 8, or the twenty-four SLC blocks shown in FIG. 6. However, the generation of the parity data in the various SLC blocks occurs prior to the on-chip copy operation. In some embodiments, and typically, the parity data in the SLC blocks is generated as data is being written into the SLC blocks, for example by XORing (or using any other suitable predefined error detection or error correction code generation method) each of N current parity data values with new data in a corresponding one of the N data sets as that data is received by the storage device and written to the SLC blocks. When the SLC blocks are full, or a predefined trigger condition is detected (e.g., after the passage of predefined amount of time, or a data flush condition is detected), the generated parity values are written to predefined pages of the SLC blocks, and then the on-chip copy operation is performed.

In some embodiments, with reference to the examples shown in FIGS. 7, 8 and 9, performing the on-chip copy may include copying data from 3P SLC blocks (e.g., 24 SLC blocks, as shown in FIG. 6) to P MLC blocks (e.g., 8 MLC blocks, as shown in FIG. 7), where P is an integer greater than one, the 3P SLC blocks include P sets of 3 SLC blocks, and the mapping, interleaving and writing is applied to each set of 3 SLC blocks to write interleaved source data to one MLC block of the P MLC blocks. Further, the 3P SLC blocks include 6P pages of parity data (e.g., 2 pages per SLC block×3P SLC blocks), which are included in 4P distinct sets of interleaved source data by said interleaving, and each of the 4P distinct sets of interleaved source data include one or two pages of parity data from one or two SLC blocks of the 3P SLC blocks. As shown in FIG. 7, the P=8 MLC blocks include 4P (i.e., 4×8) MLC pages (e.g., the MLC pages stored on logical word lines 252, 253, 254 and 255 of the eight MLC blocks) to which interleaved source data having either one or two pages of parity data is written by the OCC process. The 3P SLC blocks are sometimes called 3 SLC superblocks, or 3 SLC metablocks, and the P MLC blocks are sometimes called an MLC superblock or metablock. Furthermore, in some embodiments, the 3P SLC blocks and P MLC blocks are located in P or P/2 distinct memory die or P distinct memory planes, each having three SLC blocks of the 3P SLC blocks and on MLC block of the P MLC blocks. For example, in the examples shown in FIGS. 6-9, eight memory planes are included in four memory die. Alternately, in some other embodiments, the eight memory planes would be included in eight distinct memory die.

X4 Example

While FIGS. 6-9 show an example of an on chip copying scheme in which three bits of data are stored per memory cell in the target MLC memory blocks, in some embodiments, four bits of data are stored per memory in the target MLC memory blocks. Such memory blocks are sometimes called QLC or X4 memory bocks. In some embodiments in which the target MLC memory blocks are X4 memory blocks, data is initially stored in four SLC memory blocks, or four SLC superblocks. When those SLC memory blocks or superblocks are full, or other trigger condition is detected, an on-chip copy operation is performed. In particular, data from four SLC memory blocks is copied to each target X4 memory block. Similar to the interleaving described above with respect to FIGS. 6-9, during the on-chip copy operation, a copy of source data from a data group of a respective SLC block of the plurality of SLC blocks (e.g., four SLC blocks) is interleaved with a copy of source data from a data group of one or more other SLC blocks (e.g., three other SLC blocks) of the plurality of SLC blocks (e.g., four SLC blocks) to produce interleaved source data, the interleaved source data including a plurality of distinct sets of interleaved source data. Furthermore, each source data copy that is interleaved is rotated by an offset assigned to the respective SLC block from which the source data is copied, and each respective SLC block in the plurality of SLC blocks is assigned a distinct offset. Thus, each of the four source SLC blocks has a distinct assigned offset.

In such embodiments, the respective memory die in the non-volatile three-dimensional memory includes four SLC blocks, the MLC block (sometimes called a QLC memory block or X4 memory block) includes respective MLC pages, each respective MLC page of the MLC block including a lower page, lower-middle page, upper-middle page, and upper page, each distinct set of interleaved source data includes first, second, third and fourth pages of source data, including one page from each of the four SLC blocks, which are written to the lower page, lower-middle page, upper-middle and upper page, respectively, of a corresponding MLC page of the MLC block.

In some embodiments, in which the on-chip copy operation copies data from sets of four SLC memory blocks to corresponding QLC memory blocks, performing the on-chip copy includes copying data from 4P SLC blocks to P QLC blocks, where P is an integer greater than one, the 4P SLC blocks include P sets of 4 SLC blocks, and the mapping, interleaving and writing operations (described elsewhere in this document for embodiments in which the target memory blocks are TLC memory blocks) are applied to each set of 4 SLC blocks to write interleaved source data to one QLC block. Furthermore, the 4P SLC blocks include 8P pages of parity data, which are included in 5P distinct sets of interleaved source data by the interleaving, each of the 5P distinct sets of interleaved source data include one or two pages of parity data from one or two SLC blocks of the 4P SLC blocks.

In some such embodiments, the 4P SLC blocks and P QLC blocks are located in P or P/2 distinct memory die or P distinct memory planes, each having four SLC blocks of the 4P SLC blocks and one QLC block of the P QLC blocks.

OCC Method

Figure 10A:
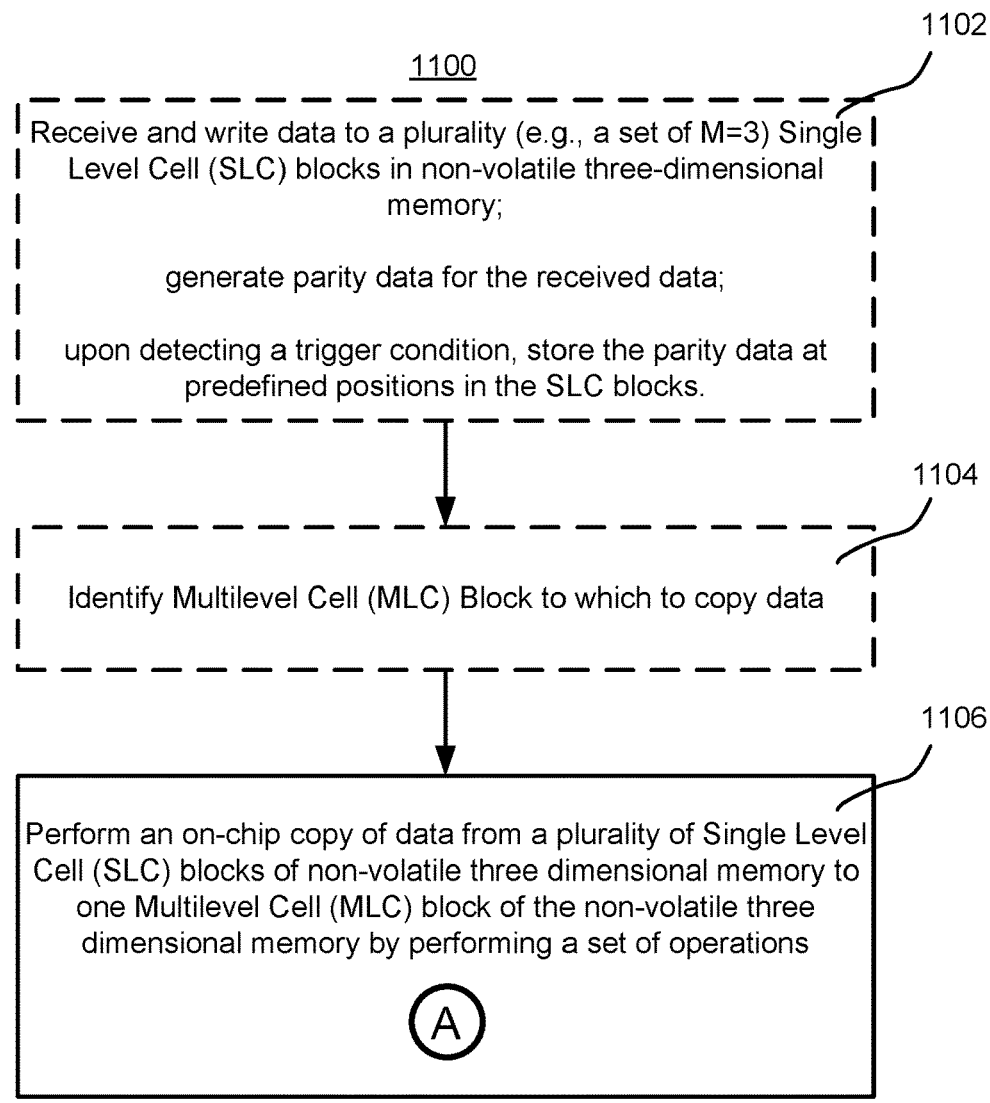
FIGS. 10A-10E illustrate a flowchart representation of a method of programming data in a respective block of a three-dimensional non-volatile memory array, in accordance with some embodiments.
Figure 10B:
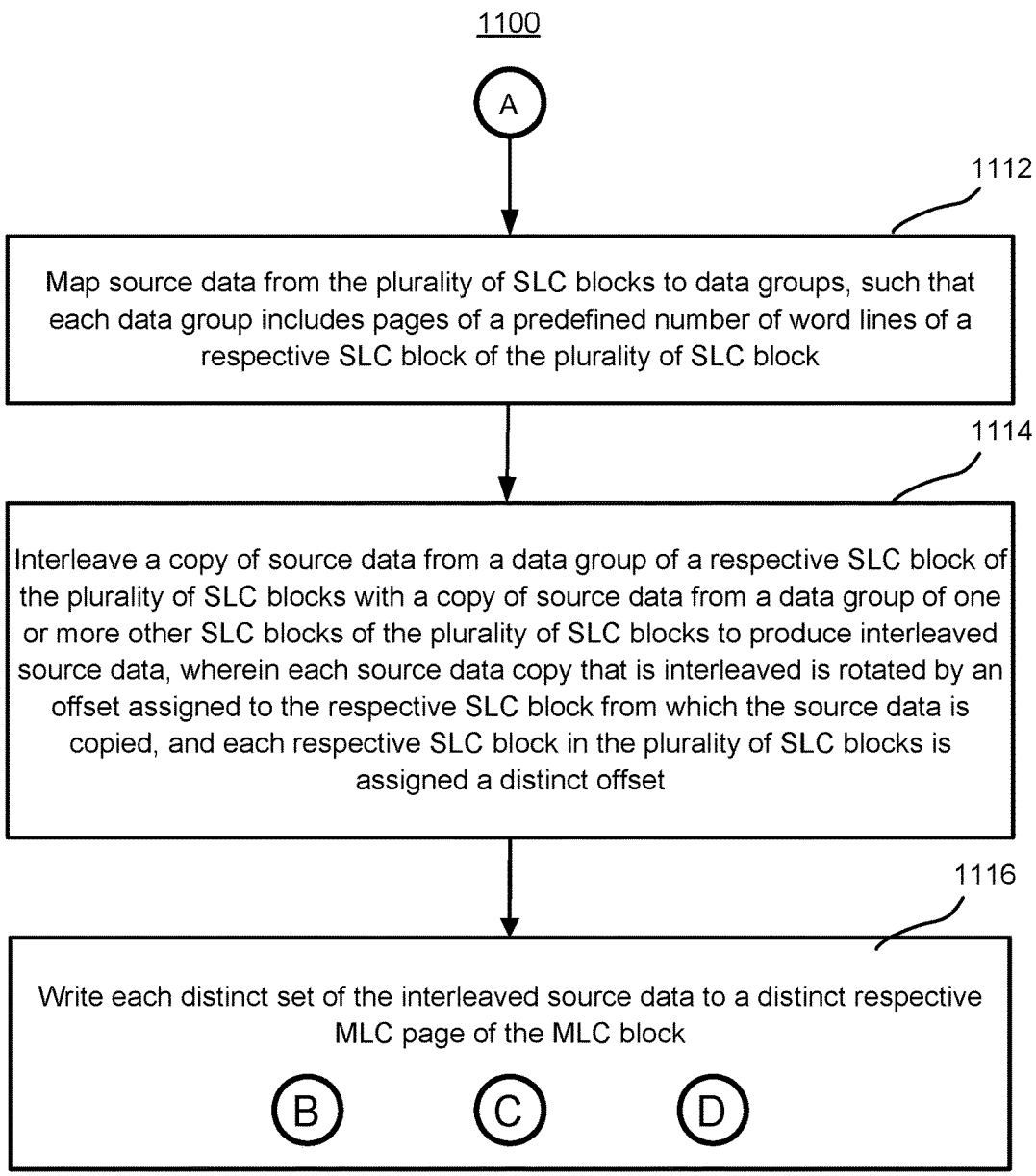
Figure 10C:
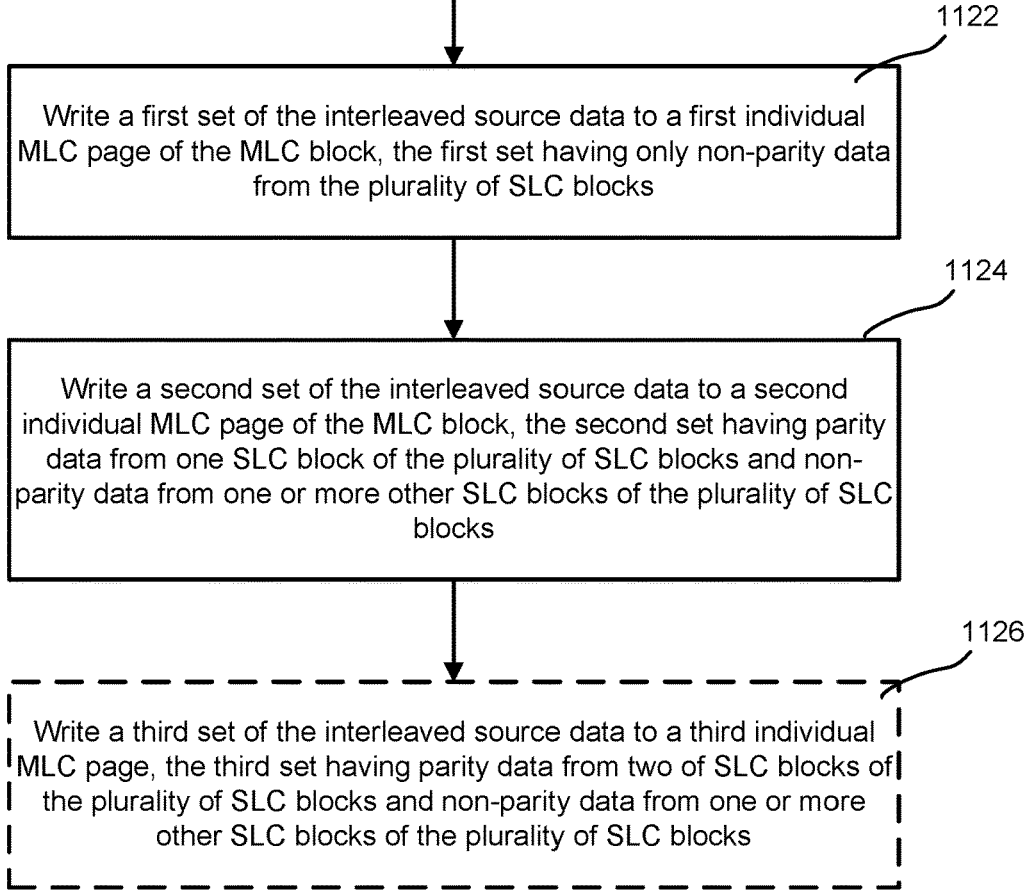
Figure 10D:
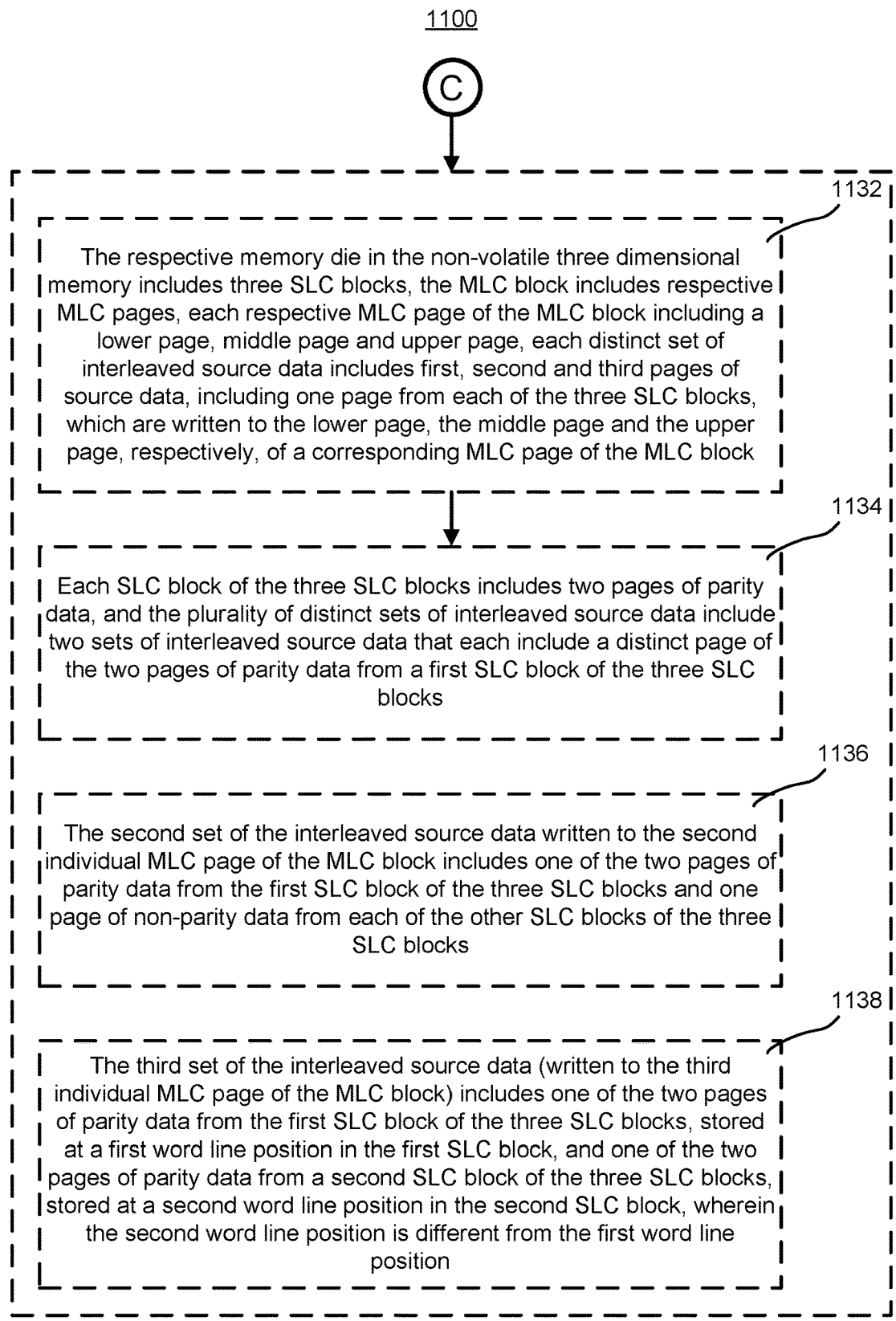
Figure 10E:
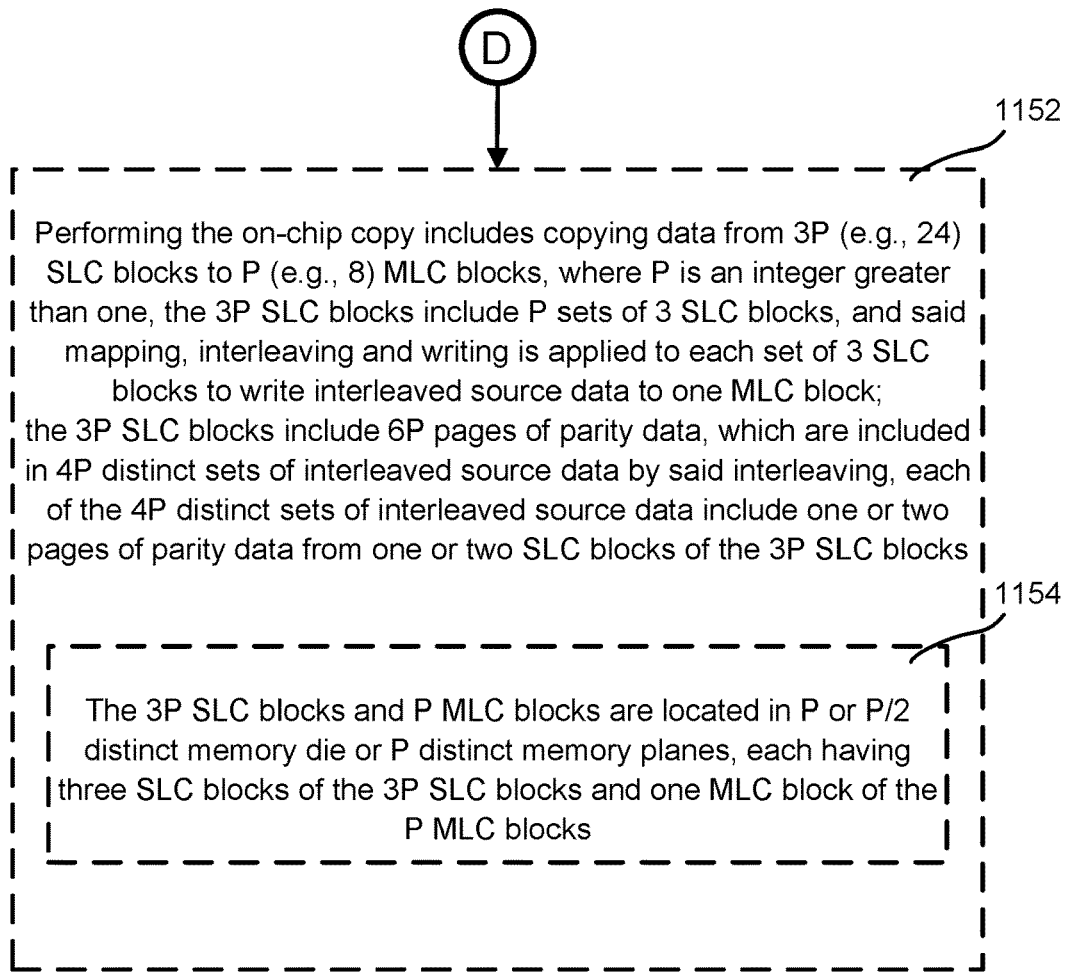

FIG. 10A illustrates an example of parity mapping of the first OCC scheme in TLC block. FIG. 10B illustrates and example of parity mapping of the disclosed OCC scheme in TLC block in accordance with some embodiments. As shown in FIG. 10A, 24 parity groups are required to protect two word lines with the first OCC scheme. Thus, this first OCC scheme requires capacity to store parity data for at least 24 parity groups. In contrast, as shown in FIG. 10B, 8 parity groups are required to protect two word lines with the disclosed OCC scheme. Thus, the disclosed OCC scheme can reduce the number of parity groups and the capacity of overhead because data to fold into one MLC block is selected from each of the plurality of SLC blocks.

The disclosed OCC scheme is also designed to mitigate the so-called "scrambler seed issue" by rotating the copied data from SLC blocks. Data rotation, using different rotation offsets assigned the different SLC blocks from which data is interleaved, ensures that the input page numbers are not the same for all the plurality of pages of a respective MLC block (e.g., LP, MP, UP of TLC block).

The disclosed OCC scheme is also designated to reduce the impact of read disturb on the integrity of parity data stored in an MLC block, by spreading the parity data over multiple word line positions and storing at least two copies of each page of parity data in two different MLC blocks, in different memory die.

The disclosed OCC scheme does not need so-called secondary parity. Instead of secondary parity, the disclosed OCC method stores at least two copies of each page of parity data, sometimes herein called forward parity and reverse parity, to ensure easy and fast recovery of data by a data recovery module 220 with no second level parity.

FIGS. 10A-10E illustrate a flowchart representation of a method 1100 of programming data in a respective block of a three-dimensional non-volatile memory array, in accordance with some embodiments. With reference to the data storage system 100 illustrated in FIG. 1, in some embodiments, method 1100 is performed by a storage device (e.g., storage device 120) or one or more components of the storage device (e.g., storage controller 124). In some embodiments, method 1100 is governed by instructions that are stored in a non-transitory computer-readable storage medium and that are executed by one or more processors of a device, such as the one or more processing units (CPUs) 122-1 of management module 121-1, FIG. 2.

For ease of explanation, method 1100 is described below as performed by a storage device (e.g., storage device 120) having non-volatile memory such as flash memory, including a non-volatile three-dimensional memory (e.g., one or more 3D flash memory die, and typically multiple 3D flash memory die) having a plurality of blocks, each block including a plurality of word lines. With reference to FIGS. 1, 2 and 5, in some embodiments, the operations of method 1100 are performed by a storage controller (e.g., storage controller 124) of the storage device (e.g., storage device 120), and in some embodiments, at least in part, by a write module (e.g., write module 214, FIG. 2) or an on-chip copy (OCC) module (e.g., OCC module 502, FIG. 5) of the storage device or storage controller.

As described above, prior to the on-chip copy operations of method 1100, data is received by the storage device and initially written to a plurality of SLC blocks (1102) in non-volatile three-dimensional memory (e.g., 3D flash memory) of the storage device's storage medium 130. For example, the SLC blocks may be used as a write buffer to which data is initially written. In some embodiments, while the data is being received and written to the SLC blocks, parity data for the received data is generated (e.g., by applying an XOR operation or other predefined error detection or error correction code generation operation to all the data assigned to each data group of several data groups in the received data), and when a trigger condition is detected (e.g., when the SLC blocks are full, or a predefined amount of time has elapsed), the parity data is stored at predefined positions in the SLC blocks. Examples of parity data stored in SLC blocks are described above, for example with reference to FIG. 8. Furthermore, a target multilevel cell (MLC) block in the non-volatile, three-dimensional memory is identified. The target MLC block is typically an erased MLC block that is ready to be programmed with data, and the data and parity data in the SLC blocks will be copied to the target MLC block during the on-chip copy operation.

As described above, and as will also be addressed again below, in some embodiments, data is initially received and written to M (e.g., three) SLC superblocks, parity data for the data in the M SLC superblocks (sometimes called metablocks) is generated, and then an OCC operation is performed to copy data from the M SLC superblocks to one MLC superblock (sometimes called a metablock). The use of superblocks during write operations facilitates efficient operation, and also facilitates efficient generation of parity data for error detection and/or correction.

In some embodiments, operations 1102 and 1104 are considered to be part of the on-chip copy operation, while in some embodiments, operations 1102 and 1104 or similar operations are performed prior to performance of the on-chip copy operation (1106). In either case, method 1100 includes performing (1106) an on-chip copy of data from a plurality of Single Level Cell (SLC) blocks of the non-volatile three-dimensional memory in a respective memory die to one Multilevel Cell (MLC) block of the non-volatile three-dimensional memory in the respective memory die.

In some embodiments, method 1100 includes mapping (1112) source data from the plurality of SLC blocks to data groups, such that each data group includes pages of a predefined number of word lines of a respective SLC block of the plurality of SLC blocks.

In addition, method 1100 includes interleaving (1114) a copy of source data from a data group of a respective SLC block (e.g., data pages from one or more word lines in the SLC block identified by SLC superblock SLC01, chip Ch0 and memory plane PL0) of the plurality of SLC blocks with a copy of source data from a data group of one or more other SLC blocks (e.g., data pages from one or more word lines, corresponding to the one or more word lines in the respective SLC block, in the SLC block identified by SLC superblock SLC02, chip Ch0 and memory plane PL0) of the plurality of SLC blocks to produce interleaved source data, the interleaved source data including a plurality of distinct sets of interleaved source data, wherein each source data copy that is interleaved is rotated by an offset assigned to the respective SLC block from which the source data is copied, and each respective SLC block in the plurality of SLC blocks is assigned a distinct offset. An example of the interleaving and rotating is described above with reference to FIG. 6.

Furthermore, method 1100 includes writing (1116) each distinct set of the interleaved source data to a distinct respective MLC page of the MLC block. Alternatively, each distinct set of the interleaved source data is written to a distinct set of two or more MLC pages of the MLC block.

In such embodiments, writing each distinct set of the interleaved source data (1116), includes writing (1122) a first set of the interleaved source data to a first individual MLC page of the MLC block, the first set having only non-parity data from the plurality of SLC blocks, and writing (1124) a second set of the interleaved source data to a second individual MLC page of the MLC block, the second set having parity data from one SLC block of the plurality of SLC blocks and non-parity data from one or more other SLC blocks of the plurality of SLC blocks. An example of the first set of the interleaved source data is shown in FIG. 7, as the data written to logical word line 0 of Chip Ch0, memory plane PL0, and an example of the second set of the interleaved source data is shown in FIG. 7, as the data written to logical word line 255 of Chip Ch0, memory plane PL0.

Furthermore, in some embodiments, writing each distinct set of the interleaved source data (1116), includes writing (1126) a third set of the interleaved source data to a third individual MLC page of the MLC block, the third set having parity data from two of SLC blocks of the plurality of SLC blocks and non-parity data from one or more other SLC blocks of the plurality of SLC blocks. An example of the third set of the interleaved source data is shown in FIG. 7, as the data written to logical word line 254 of Chip Ch0, memory plane PL0.

In some embodiments, the respective memory die in the non-volatile three-dimensional memory includes (1132) three SLC blocks, the MLC block includes respective MLC pages, each respective MLC page of the MLC block including a lower page, middle page and upper page, each distinct set of interleaved source data includes three pages of source data, including one page from each of the three SLC blocks, which are written to the lower page, the middle page and the upper page of a corresponding MLC page of the MLC block. For example, FIGS. 6 and 7 show an example with three SLC blocks and the one MLC block in each memory plane of each of four memory die, and the MLC blocks shown in FIG. 7 each includes MLC pages, each designed by a logical word line (TCL LWL) and each having lower, middle and upper pages to which a set of interleaved source data is written, for example using the data interleaving and rotation pattern shown in FIG. 6.

In some embodiments, each SLC block of the three SLC blocks includes (1134) two pages of parity data, and the plurality of distinct sets of interleaved source data include two sets of interleaved source data that each include a distinct page of the two pages of parity data from a first SLC block of the three SLC blocks. For example, FIG. 8 shows eight SLC blocks, each having two pages of parity data, one in parity set 802 and the other in parity set 804. As described above with reference to FIG. 6 and FIG. 8, in some embodiments the three SLC blocks from which source data is copied and interleaved to form sets of interleaved source data are from three different SLC superblocks, one of which is shown in FIG. 8; portions of all three are shown in FIG. 6.

In some embodiments, the second set of interleaved source data (see above discussion of 1124) written to the second individual MLC block includes (1136) one of the two pages of parity data from the first SLC block of the three SLC blocks and one page of non-parity data from each of the other SLC blocks of the three SLC blocks. For example, as shown in FIG. 7, a second set of interleaved source data is written to the MLC block at logical word line 255 and has one page of parity data from the first SLC block, and one page of non-parity data from the second and third SLC blocks.

In some embodiments, the third set of interleaved source data includes (1138) one of the 2 pages of parity data from the first SLC block of the three SLC blocks, stored at a first word line position in the first SLC block, and one of the 2 pages of parity data from a second SLC block of the three SLC blocks, stored at a second word line position in the second SLC block, wherein the second word line position is different from the first word line position. For example, as discussed above with respect to FIGS. 7 and 9, the third set of interleaved source data may be the set stored to the MLC block at logical word line position 254, with the parity data from the first SLC block first coming from word line position 254 and the parity data from the second SLC block coming from word line position 255. In the example shown in FIG. 7, the third page of data included in the third set of interleaved source data is non-parity data from word line position 252 of the third SLC block.

In some embodiments, performing (1152) the on-chip copy includes copying data from 3P SLC blocks to P MLC blocks, where PN is an integer greater than one, the 3PN SLC blocks include P sets of 3 SLC blocks, and said mapping, interleaving and writing is applied to each set of 3 SLC blocks to write interleaved source data to one MLC block. Further, the 3P SLC blocks include 6P pages of parity data, which are included in 4P distinct sets of interleaved source data by said interleaving, each of the 4P distinct sets of interleaved source data include one or two pages of parity data from one or two SLC blocks of the 3P SLC blocks. For example, FIG. 6 shows three SLC superblocks having a total of 24 (3P, where P=8) SLC blocks, each of which has two page of parity data, for a total of 48 (e.g., 4P, where P=8) pages of parity data. Furthermore, in the example shown in FIGS. 7 and 9, four pages of each MLC block include parity data, and since there are eight MLC blocks in the MLC superblock, there are 4P or 32 (4P=4*8=32) MLC pages in the MLC superblock that include parity data, each of which corresponds to a distinct set of interleaved source data in the three SLC superblocks, and thus there are 4P or 32 distinct sets of interleaved source data that each include one or two pages of parity data from one or two SLC blocks of the 3P SLC blocks.

In some embodiments, the 3P SLC blocks and P MLC blocks are (1154) located in P distinct memory die or P distinct memory planes, each having three SLC blocks of the 3P SLC blocks and one MLC block of the P MLC blocks. For example, in the example shown in FIGS. 6-9, each SLC superblock includes SLC blocks in four (P/2=8/2=4) distinct memory die (chips Ch0, Ch1, Ch2 and Ch3), and eight (P=8) distinct memory planes (planes PL0 and PL1 of the four memory die). In some embodiments in which the memory die have only one plane per memory die, the four chips of this example would be replaced by eight chips (memory die) in order to provide the same amount of storage as in the example shown in FIGS. 6-9.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method for managing data in a storage device having one or more memory die, each memory die comprising a non-volatile three-dimensional memory having a plurality of blocks, each block including a plurality of word lines, the method comprising:
    performing an on-chip copy of data from a plurality of Single Level Cell (SLC) blocks of the non-volatile three-dimensional memory in a respective memory die to one Multilevel Cell (MLC) block of the non-volatile three-dimensional memory in the respective memory die by performing a set of operations comprising:
        mapping source data from the plurality of SLC blocks to data groups, such that each data group includes pages of a predefined number of word lines of a respective SLC block of the plurality of SLC blocks;
        interleaving a copy of source data from a data group of a respective SLC block of the plurality of SLC blocks with a copy of source data from a data group of one or more other SLC blocks of the plurality of SLC blocks to produce interleaved source data, the interleaved source data including a plurality of distinct sets of interleaved source data;
        wherein each source data copy that is interleaved is rotated by an offset assigned to the respective SLC block from which the source data is copied, and each respective SLC block in the plurality of SLC blocks is assigned a distinct offset; and
        writing each distinct set of the interleaved source data to a distinct respective MLC page of the MLC block, including writing a first set of the interleaved source data to a first individual MLC page of the MLC block and writing a second set of the interleaved source data to a second individual MLC page of the MLC block, the first set having only non-parity data from the plurality of SLC blocks, and the second set having parity data from one SLC block of the plurality of SLC blocks and non-parity data from one or more other SLC blocks of the plurality of SLC blocks.

2. The method of claim 1, wherein the writing includes: writing a third set of the interleaved source data to a third individual page, the third set having parity data from two of SLC blocks of the plurality of SLC blocks and non-parity data from one or more other SLC blocks of the plurality of SLC blocks.

3. The method of claim 1, wherein
the respective memory die in the non-volatile three-dimensional memory includes three SLC blocks, the MLC block includes respective MLC pages, each respective MLC page of the MLC block including a lower page, middle page and upper page, each distinct set of interleaved source data includes first, second and third pages of source data, including one page from each of the three SLC blocks, which are written to the lower page, the middle page and the upper page, respectively, of a corresponding MLC page of the MLC block.

4. The method of claim 3, wherein
each SLC block of the three SLC blocks includes two pages of parity data, and the plurality of distinct sets of interleaved source data include two sets of interleaved source data that each include a distinct page of the two pages of parity data from a first SLC block of the three SLC blocks.

5. The method of claim 4, wherein the second set of the interleaved source data written to the second individual MLC page of the MLC block includes one of the two pages of parity data from the first SLC block of the three SLC blocks and one page of non-parity data from each of the other SLC blocks of the three SLC blocks.

6. The method of claim 4, wherein the third set of interleaved data includes one of the two pages of parity data from the first SLC block of the three SLC blocks, stored at a first word line position in the first SLC block, and one of the two pages of parity data from a second SLC block of the three SLC blocks, stored at a second word line position in the second SLC block, wherein the second word line position is different from the first word line position.

7. The method of claim 1, wherein
performing the on-chip copy includes copying data from 3P SLC blocks to P MLC blocks, where P is an integer greater than one, the 3P SLC blocks include P sets of 3 SLC blocks, and said mapping, interleaving and writing is applied to each set of 3 SLC blocks to write interleaved source data to one MLC block; and
the 3P SLC blocks include 6P pages of parity data, which are included in 4P distinct sets of interleaved source data by said interleaving, each of the 4P distinct sets of interleaved source data include one or two pages of parity data from one or two SLC blocks of the 3P SLC blocks.

8. The method of claim 7, wherein the 3P SLC blocks and P MLC blocks are located in P or P/2 distinct memory die or P distinct memory planes, each having three SLC blocks of the 3P SLC blocks and one MLC block of the P MLC blocks.

9. The method of claim 1, wherein
the respective memory die in the non-volatile three-dimensional memory includes four SLC blocks, the MLC block includes respective MLC pages, each respective MLC page of the MLC block including a lower page, lower-middle page, upper-middle page, and upper page, each distinct set of interleaved source data includes first, second, third and fourth pages of source data, including one page from each of the four SLC blocks, which are written to the lower page, the lower-middle page, the upper-middle page, and the upper page, respectively, of a corresponding MLC page of the MLC block.

10. The method of claim 1, wherein
performing the on-chip copy includes copying data from 4P SLC blocks to 4 MLC blocks, where P is an integer greater than one, the 4P SLC blocks include P sets of 4 SLC blocks, and said mapping, interleaving and writing is applied to each set of 4 SLC blocks to write interleaved source data to one MLC block; and
the 4P SLC blocks include 8P pages of parity data, which are included in 5P distinct sets of interleaved source data by said interleaving, each of the 5P distinct sets of interleaved source data include one or two pages of parity data from one or two SLC blocks of the 4P SLC blocks.

11. The method of claim 10, wherein the 4P SLC blocks and P MLC blocks are located in P or P/2 distinct memory die or P distinct memory planes, each having four SLC blocks of the 4P SLC blocks and one MLC block of the P MLC blocks.

12. A storage device comprising:
one or more memory die, each memory die comprising a non-volatile three-dimensional memory having a plurality of blocks, each block including a plurality of word lines;
one or more processors; and
controller memory storing one or more programs, which when executed by the one or more processors cause the storage device to perform operations comprising:
performing an on-chip copy of data from a plurality of Single Level Cell (SLC) blocks of the non-volatile three-dimensional memory in a respective memory die to one Multilevel Cell (MLC) block of the non-volatile three-dimensional memory in the respective memory die by performing a set of operations comprising:
mapping source data from the plurality of SLC blocks to data groups, such that each data group includes pages of a predefined number of word lines of a respective SLC block of the plurality of SLC blocks;
interleaving a copy of source data from a data group of a respective SLC block of the plurality of SLC blocks with a copy of source data from a data group of one or more other SLC blocks of the plurality of SLC blocks to produce interleaved source data, the interleaved source data including a plurality of distinct sets of interleaved source data;
wherein each source data copy that is interleaved is rotated by an offset assigned to the respective SLC block from which the source data is copied, and each respective SLC block in the plurality of SLC blocks is assigned a distinct offset; and
writing each distinct set of the interleaved source data to a distinct respective MLC page of the MLC block, including writing a first set of the interleaved source data to a first individual MLC page of the MLC block and writing a second set of the interleaved source data to a second individual MLC page of the MLC block, the first set having only non-parity data from the plurality of SLC blocks, and the second set having parity data from one SLC block of the plurality of SLC blocks and non-parity data from one or more other SLC blocks of the plurality of SLC blocks.

13. The storage device of claim 12, wherein the writing includes:
writing a third set of the interleaved source data to a third individual page, the third set having parity data from two of SLC blocks of the plurality of SLC blocks and non-parity data from one or more other SLC blocks of the plurality of SLC blocks.

14. The storage device of claim 12, wherein
the respective memory die in the non-volatile three-dimensional memory includes three SLC blocks, the MLC block includes respective MLC pages, each respective MLC page of the MLC block including a lower page, middle page and upper page, each distinct set of interleaved source data includes first, second and third pages of source data, including one page from each of the three SLC blocks, which are written to the lower page, the middle page and the upper page, respectively, of a corresponding MLC page of the MLC block.

15. The storage device of claim 14, wherein
each SLC block of the three SLC blocks includes two pages of parity data, and the plurality of distinct sets of interleaved source data include two sets of interleaved source data that each include a distinct page of the two pages of parity data from a first SLC block of the three SLC blocks.

16. The storage device of claim 15, wherein the second set of the interleaved source data written to the second individual MLC page of the MLC block includes one of the two pages of parity data from the first SLC block of the three SLC blocks and one page of non-parity data from each of the other SLC blocks of the three SLC blocks.

17. The storage device of claim 15, wherein the third set of interleaved data includes one of the two pages of parity data from the first SLC block of the three SLC blocks, stored at a first word line position in the first SLC block, and one of the two pages of parity data from a second SLC block of the three SLC blocks, stored at a second word line position in the second SLC block, wherein the second word line position is different from the first word line position.

18. The storage device of claim 12, wherein
performing the on-chip copy includes copying data from 3P SLC blocks to P MLC blocks, where P is an integer greater than one, the 3P SLC blocks include P sets of 3 SLC blocks, and said mapping, interleaving and writing is applied to each set of 3 SLC blocks to write interleaved source data to one MLC block; and
the 3P SLC blocks include 6P pages of parity data, which are included in 4P distinct sets of interleaved source data by said interleaving, each of the 4P distinct sets of interleaved source data include one or two pages of parity data from one or two SLC blocks of the 3P SLC blocks.

19. The storage device of claim 18, wherein the 3P SLC blocks and P MLC blocks are located in P or P/2 distinct memory die or P distinct memory planes, each having three SLC blocks of the 3P SLC blocks and one MLC block of the P MLC blocks.

20. The storage device of claim 12, wherein the one or more memory die comprise three-dimensional flash memory die.

21. A non-transitory computer readable storage medium, storing one or more programs configured for execution by one or more processors of a storage device having one or more memory die, each memory die comprising a non-volatile three-dimensional memory having a plurality of blocks, each block including a plurality of word lines, the one or more programs including instructions for:
performing an on-chip copy of data from a plurality of Single Level Cell (SLC) blocks of the non-volatile three-dimensional memory in a respective memory die to one Multilevel Cell (MLC) block of the non-volatile three-dimensional memory in the respective memory die by performing a set of operations comprising:
mapping source data from the plurality of SLC blocks to data groups, such that each data group includes pages of a predefined number of word lines of a respective SLC block of the plurality of SLC block;
interleaving a copy of source data from a data group of a respective SLC block of the plurality of SLC blocks with a copy of source data from a data group of one or more other SLC blocks of the plurality of SLC blocks to produce interleaved source data, the interleaved source data including a plurality of distinct sets of interleaved source data;
wherein each source data copy that is interleaved is rotated by an offset assigned to the respective SLC block from which the source data is copied, and each respective SLC block in the plurality of SLC blocks is assigned a distinct offset; and
writing each distinct set of the interleaved source data to a distinct respective MLC page of the MLC block, including writing a first set of the interleaved source data to a first individual MLC page of the MLC block and writing a second set of the interleaved source data to a second individual MLC page of the MLC block, the first set having only non-parity data from the plurality of SLC blocks, and the second set having parity data from one SLC block of the plurality of SLC blocks and non-parity data from one or more other SLC blocks of the plurality of SLC blocks.

22. The non-transitory computer readable storage medium of claim 21, wherein the writing includes:
writing a third set of the interleaved source data to a third individual page, the third set having parity data from two of SLC blocks of the plurality of SLC blocks and non-parity data from one or more other SLC blocks of the plurality of SLC blocks.

23. The non-transitory computer readable storage medium of claim 21, wherein
the respective memory die in the non-volatile three-dimensional memory includes three SLC blocks, the MLC block includes respective MLC pages, each respective MLC page of the MLC block including a lower page, middle page and upper page, each distinct set of interleaved source data includes first, second and third pages of source data, including one page from each of the three SLC blocks, which are written to the lower page, the middle page and the upper page, respectively, of a corresponding MLC page of the MLC block.

24. The non-transitory computer readable storage medium of claim 23, wherein
each SLC block of the three SLC blocks includes two pages of parity data, and the plurality of distinct sets of interleaved source data include two sets of interleaved source data that each include a distinct page of the two pages of parity data from a first SLC block of the three SLC blocks.

* * * * *